United States Patent
Katti

(10) Patent No.: US 8,427,199 B2
(45) Date of Patent: Apr. 23, 2013

(54) MAGNETIC LOGIC GATE

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/916,174

(22) Filed: Oct. 29, 2010

(65) Prior Publication Data

US 2012/0105103 A1 May 3, 2012

(51) Int. Cl.
*H03K 19/173* (2006.01)
*H03K 19/20* (2006.01)
*G11C 11/15* (2006.01)

(52) U.S. Cl.
USPC .............................. 326/38; 326/104; 365/173

(58) Field of Classification Search .............. 326/37–41, 326/104, 112; 365/171, 173
See application file for complete search history.

(56) References Cited

U.S. PATENT DOCUMENTS

| | | | |
|---|---|---|---|
| 5,739,704 A | 4/1998 | Clark | |
| 6,034,887 A * | 3/2000 | Gupta et al. | 365/171 |
| 6,050,335 A | 4/2000 | Parsons | |
| 6,343,032 B1 | 1/2002 | Black et al. | |
| 6,351,409 B1 | 2/2002 | Rizzo et al. | |
| 6,526,559 B2 | 2/2003 | Schiefele et al. | |
| 6,657,888 B1 | 12/2003 | Doudin et al. | |
| 6,809,900 B2 | 10/2004 | Covington | |
| 6,950,335 B2 | 9/2005 | Dieny et al. | |
| 6,985,318 B2 | 1/2006 | Clinton et al. | |
| 6,985,930 B2 | 1/2006 | Oikawa | |
| 6,992,501 B2 | 1/2006 | Rapport | |
| 7,075,807 B2 | 7/2006 | Leuschner et al. | |
| 7,096,437 B2 | 8/2006 | Ditto et al. | |
| 7,116,576 B2 | 10/2006 | Smith et al. | |
| 7,218,139 B1 | 5/2007 | Young et al. | |
| 7,241,631 B2 | 7/2007 | Huai et al. | |
| 7,267,999 B2 | 9/2007 | Drewes | |
| 7,332,781 B2 | 2/2008 | Nozieres et al. | |
| 7,379,321 B2 * | 5/2008 | Ravelosona et al. | 365/145 |

(Continued)

FOREIGN PATENT DOCUMENTS

| | | |
|---|---|---|
| EP | 0 575 738 A2 | 12/1993 |
| EP | 2 172 969 A1 | 4/2010 |
| WO | 2010/029326 A1 | 3/2010 |
| WO | 2010024126 A1 | 3/2010 |

OTHER PUBLICATIONS

Mukherjee et al., "Switching of Composite Media by Wall Propagation," Journal of Applied Physics, vol. 99, No. 8, Apr. 15, 2006, 3 pages.

(Continued)

*Primary Examiner* — Shawki Ismail
*Assistant Examiner* — Dylan White
(74) *Attorney, Agent, or Firm* — Shumaker & Sieffert, P.A.

(57) ABSTRACT

This disclosure is directed to a magnetic logic device for implementing a combinational logic function. The magnetic logic device may include a network of at least two magnetoresistive devices electrically coupled in parallel. The magnetic logic device may further include a voltage source configured to apply a voltage between a first terminal and a second terminal of the network of at least two magnetoresistive devices electrically coupled in parallel. The magnetic logic device may further include a logic output generator configured to generate a logic output value for a logic function based on a magnitude of a current produced at the second terminal of the network in response to the applied voltage.

20 Claims, 16 Drawing Sheets

U.S. PATENT DOCUMENTS

| | | | |
|---|---|---|---|
| 7,394,684 | B2 | 7/2008 | Inokuchi et al. |
| 7,397,285 | B2 | 7/2008 | Agan et al. |
| 7,400,166 | B2 * | 7/2008 | Bangert ............................. 326/37 |
| 7,425,377 | B2 | 9/2008 | Fullerton et al. |
| 7,465,502 | B2 | 12/2008 | Gusliyenko |
| 7,596,018 | B2 | 9/2009 | Johnson |
| 7,630,231 | B2 | 12/2009 | Miltat et al. |
| 7,684,233 | B2 | 3/2010 | Lim et al. |
| 7,710,766 | B2 | 5/2010 | Mullner et al. |
| 7,719,881 | B2 | 5/2010 | Bangert |
| 7,825,686 | B2 | 11/2010 | Hoeink et al. |
| 7,852,665 | B2 | 12/2010 | Chen et al. |
| 7,870,472 | B2 | 1/2011 | Thorp et al. |
| 7,940,592 | B2 | 5/2011 | Reed et al. |
| 8,027,206 | B2 | 9/2011 | Yoon et al. |
| 8,159,864 | B2 | 4/2012 | Yoon et al. |
| 8,208,295 | B2 | 6/2012 | Dieny |
| 2003/0227907 | A1 * | 12/2003 | Choi et al. ..................... 370/352 |
| 2004/0108561 | A1 | 6/2004 | Jeong |
| 2006/0125034 | A1 | 6/2006 | Ohba et al. |
| 2006/0145806 | A1 * | 7/2006 | Kim et al. ..................... 336/200 |
| 2006/0176620 | A1 * | 8/2006 | Ravelosona et al. ....... 360/324.2 |
| 2007/0063237 | A1 | 3/2007 | Huai et al. |
| 2007/0091509 | A1 | 4/2007 | Yi et al. |
| 2007/0224454 | A1 | 9/2007 | Ingvarsson et al. |
| 2008/0100345 | A1 | 5/2008 | Bratkoviski et al. |
| 2008/0150578 | A1 | 6/2008 | Kiel et al. |
| 2008/0238475 | A1 | 10/2008 | Chua-Eoan |
| 2008/0278196 | A1 | 11/2008 | Ditto et al. |
| 2009/0027949 | A1 | 1/2009 | Koga et al. |
| 2009/0046501 | A1 | 2/2009 | Ranjan et al. |
| 2009/0067225 | A1 | 3/2009 | Mryasov et al. |
| 2009/0103354 | A1 | 4/2009 | Yoon et al. |
| 2009/0296462 | A1 | 12/2009 | Kent et al. |
| 2009/0317923 | A1 | 12/2009 | Sun et al. |
| 2009/0323402 | A1 | 12/2009 | Li et al. |
| 2010/0039136 | A1 * | 2/2010 | Chua-Eoan et al. ............ 326/38 |
| 2010/0078723 | A1 | 4/2010 | Bertin et al. |
| 2010/0080048 | A1 | 4/2010 | Liu et al. |
| 2010/0080054 | A1 | 4/2010 | Abe |
| 2010/0090262 | A1 * | 4/2010 | Saito et al. ..................... 257/295 |
| 2010/0110757 | A1 | 5/2010 | Ma et al. |
| 2010/0142260 | A1 | 6/2010 | Yoon et al. |
| 2010/0148288 | A1 | 6/2010 | Johnson |
| 2010/0194431 | A1 * | 8/2010 | Chua-Eoan et al. ............ 326/40 |
| 2010/0219858 | A1 | 9/2010 | Ditto et al. |
| 2010/0315123 | A1 * | 12/2010 | Niemier et al. ................. 326/52 |
| 2011/0006807 | A1 | 1/2011 | Schneiderwind |
| 2011/0007558 | A1 | 1/2011 | Mryasov et al. |
| 2011/0026336 | A1 | 2/2011 | Huang et al. |
| 2012/0014166 | A1 | 1/2012 | Ma et al. |
| 2012/0081950 | A1 | 4/2012 | Slaughter |

OTHER PUBLICATIONS

Lybertatos et al., "Thermal Effects in the High-Speed Switching of the Magnetization of Fine Grains," Published in Intermag Europe 2002 Digest of Technical Papers, 2002 IEEE International Magnetics Conference, Apr. 28-May 2, 2002, 1 page.

S. Matsunaga et al., "MTJ-Based Nonvolatile Logic-In-Memory Circuit, Future Prospects and Issues," Apr. 20-24, 2009, 3 pages, retrieved from http://www.date-conference.com/proceedings/PAPERS/2009/DATE09/PDFFILES/05.2_1.PDF.

Y. Nozaki et al., "Size Dependence of Switching Current and Energy Barrier in the Magnetization Reversal of Rectangular Magnetic Random Access Memory Cell," Journal of Applied Physics, vol. 93, No. 10, 3 pages, May 15, 2003.

Lybertatos et al., "Thermal Effects in the High-Speed Switching of the Magnetization of Fine Gains," Published in Intermag Europe 2002 Digest of Technical Papers, 2002 IEEE International Magnetics Conference, Apr. 28-May 2, 2002. Abstract only, retrieved from the internet at http://sciencelinks.jp/j-east/article/200312/000020031203A0344537.php.

Mukherjee et al., "Switching of Composite Media by Wall Propagation," Published in Journal of Applied Physics, vol. 99, No. 8, Apr. 15, 2006. Citation retrieved from DailogWeb. Abstract retrieved from the Internet at http://jap.aip.org/japiau/v99/i8/p08q909_sl?isAuthorized=no.

M. Caruso et al., "A New Prospective on Magnetic Field Sensing," 19 pgs., May 1998 downloaded from http://www.ssec.honeywell.com/magnetic/datasheets/new_pers.pdf.

G. A. Prinz, "Magnetoelectronics Applications," Journal of Magnetism and Magnetic Materials 200, pp. 57-68, 1999.

R. Katti, "Magnetic Logic Gate", filed Oct. 29, 2010.

R. Katti, "Magnetic Logic Gate," filed Oct. 29, 2010.

R. Katti, "Reduced Switching-Energy Magnetic Elements," filed Oct. 29, 2010.

Office Action from U.S. Appl. No. 12/916,046, dated Oct. 11, 2011, 13 pp.

Response to Office Action dated Oct. 11, 2011, from U.S. Appl. No. 12/916,046, dated Jan. 11, 2012, 8 pp.

Office Action from U.S. Appl. No. 12/916,046, dated Apr. 4, 2012, 13 pp.

Responsive amendment dated Oct. 10, 2012, for U.S. Appl. No. 13/161,070, 5 pages.

Notice of Allowance dated May 11, 2012, for U.S. Appl. No. 12/916,119, 17 pages.

Office Action dated Apr. 4, 2012, for U.S. Appl. No. 12/916,046, 17 pages.

Response dated Jul. 5, 2012, for U.S. Appl. No. 12/916,046, 6 pages.

Office Action dated Jul. 10, 2012, for U.S. Appl. No. 13/161,070, 8 pages.

Li et al., "Ultrahigh-Speed Reconfigurable Logic Gates Based on Four-Wave Mixing in a Semiconductor Optical Amplifier," IEEE Photonics Technology Letters, vol. 18, No. 12, Jun. 15, 2006, 3 pages.

Notice of Allowance from U.S. Appl. No. 13/161,070, dated Nov. 7, 2012, 7 pages.

* cited by examiner

| A:INPUT | B:INPUT | A:WRITE | B:WRITE | A:RES | B:RES | $I_{READ}$ | AND FUNCTION | OR FUNCTION |
|---|---|---|---|---|---|---|---|---|
| LOGIC 0 | LOGIC 0 | POL-0 | POL-0 | HIGH | HIGH | LOW | LOGIC 0 | LOGIC 0 |
| LOGIC 0 | LOGIC 1 | POL-0 | POL-1 | HIGH | LOW | INT | LOGIC 0 | LOGIC 1 |
| LOGIC 1 | LOGIC 0 | POL-1 | POL-0 | LOW | HIGH | INT | LOGIC 0 | LOGIC 1 |
| LOGIC 1 | LOGIC 1 | POL-1 | POL-1 | LOW | LOW | HIGH | LOGIC 1 | LOGIC 1 |

FIG. 10

MAGNETIC LOGIC GATE

This disclosure relates to logic gates, and more particularly, to magnetic logic gates.

BACKGROUND

Logic gates are fundamental to the design and implementation of integrated circuits and computer processors. One process technology that is commonly used to implement logic gates is a Complementary Metal-Oxide-Semiconductor (CMOS) process technology. In a typical CMOS implementation, a logic gate may be implemented by using a set of n-type metal oxide semiconductor field effect transistors (MOSFETs) along with a complementary set of p-type MOSFETs. Each logic gate typically has at least one n-type MOSFET and at least one p-type MOSFET associated with each logic input of the logic function. The MOSFETs are configured such that the output of the logic gate is pulled-up to a high voltage level or pulled-down to a low voltage level depending on the input values of the logic function.

SUMMARY

This disclosure is directed to a magnetic logic gate for implementing a combinational logic function. The magnetic logic gate may include at least two or more magnetoresistive devices. During a write phase, a write circuit may program the magnetization states of the magnetoresistive devices to correspond to the logic input values of the combinational logic function. During a read phase, the magnetoresistive devices may be electrically coupled in parallel to form a network of magnetoresistive devices. A voltage may be applied across the network of magnetoresistive devices to induce a read current to propagate through the network. The magnitude of the read current may be indicative of the magnetization states of the magnetoresistive devices in the network. The magnetic logic gate may map the magnitude of the read current to a logic output value. The logic output value may correspond to the value obtained when the combinational logic function is applied to the logic input values.

In some examples, the magnetic logic gate may be able to implement a plurality of different combinational logic functions. The particular function selected for a given logic operation may be determined based on a function select input received from a user of the device. The magnetic logic gate may select a particular mapping between the read current magnitude levels and the logic output values to implement the combinational logic function indicated by the function select input. In this manner, the magnetic logic device may be able to use the same underlying magnetoresistive device structure to perform multiple types of combinational logic operations.

According to one example, a method includes applying a voltage between a first terminal and a second terminal of a network of at least two magnetoresistive devices electrically coupled in parallel. The method further includes generating a logic output value for a logic function based on a magnitude of a current produced at the second terminal of the network in response to the applied voltage.

According to another example, a device includes a network of at least two magnetoresistive devices electrically coupled in parallel. The device further includes a voltage source configured to apply a voltage between a first terminal and a second terminal of the network of at least two magnetoresistive devices electrically coupled in parallel. The device further includes a logic output generator configured to generate a logic output value for a logic function based on a magnitude of a current produced at the second terminal of the network in response to the applied voltage.

According to another example, an apparatus includes means for applying a voltage between a first terminal and a second terminal of a network of at least two magnetoresistive devices electrically coupled in parallel. The apparatus further includes means for generating a logic output value for a logic function based on a magnitude of a current produced at the second terminal of the network in response to the applied voltage.

The details of one or more examples are set forth in the accompanying drawings and the description below. Other features, objects, and advantages will be apparent from the description and drawings, and from the claims.

BRIEF DESCRIPTION OF DRAWINGS

FIG. 10 is a truth table illustrating example functionality for the magnetic logic device of FIG. 3 according to this disclosure.

DETAILED DESCRIPTION

This disclosure is directed to a magnetic logic gate for implementing a combinational logic function. The magnetic logic gate may include at least two or more magnetoresistive devices. During a write phase, a write circuit may program the magnetization states of the magnetoresistive devices to correspond to the logic input values of the combinational logic function. During a read phase, the magnetoresistive devices may be electrically coupled in parallel to form a network of magnetoresistive devices. A voltage may be applied across the network of magnetoresistive devices to induce a read current to propagate through the network. The magnitude of the read current may be indicative of the magnetization states of the magnetoresistive devices in the network. The magnetic logic gate may map the magnitude of the read current to a logic output value. The logic output value may correspond to the value obtained when the combinational logic function is applied to the logic input values.

In some examples, the magnetic logic gate may be able to implement a plurality of different combinational logic functions. The particular function selected for a given logic operation may be determined based on a function select input received from a user of the device. The magnetic logic gate may select a particular mapping between the read current magnitude levels and the logic output values to implement the combinational logic function indicated by the function select input. In this manner, the magnetic logic device may be able to use the same underlying magnetoresistive device structure to perform multiple types of combinational logic operations.

The techniques described herein may be able to produce integrated circuits having lower power consumption and/or increased chip density in comparison to integrated circuits that implement equivalent logic using a CMOS process technology. In contrast to transistor-based CMOS logic gates, the magnetic logic gates designed in accordance with this disclosure may be non-volatile, i.e., such gates may retain their state even if the logic gate is not receiving power. In addition, the techniques in this disclosure may be able to be monolithically integrated with conventional CMOS electronics.

Figure 1:
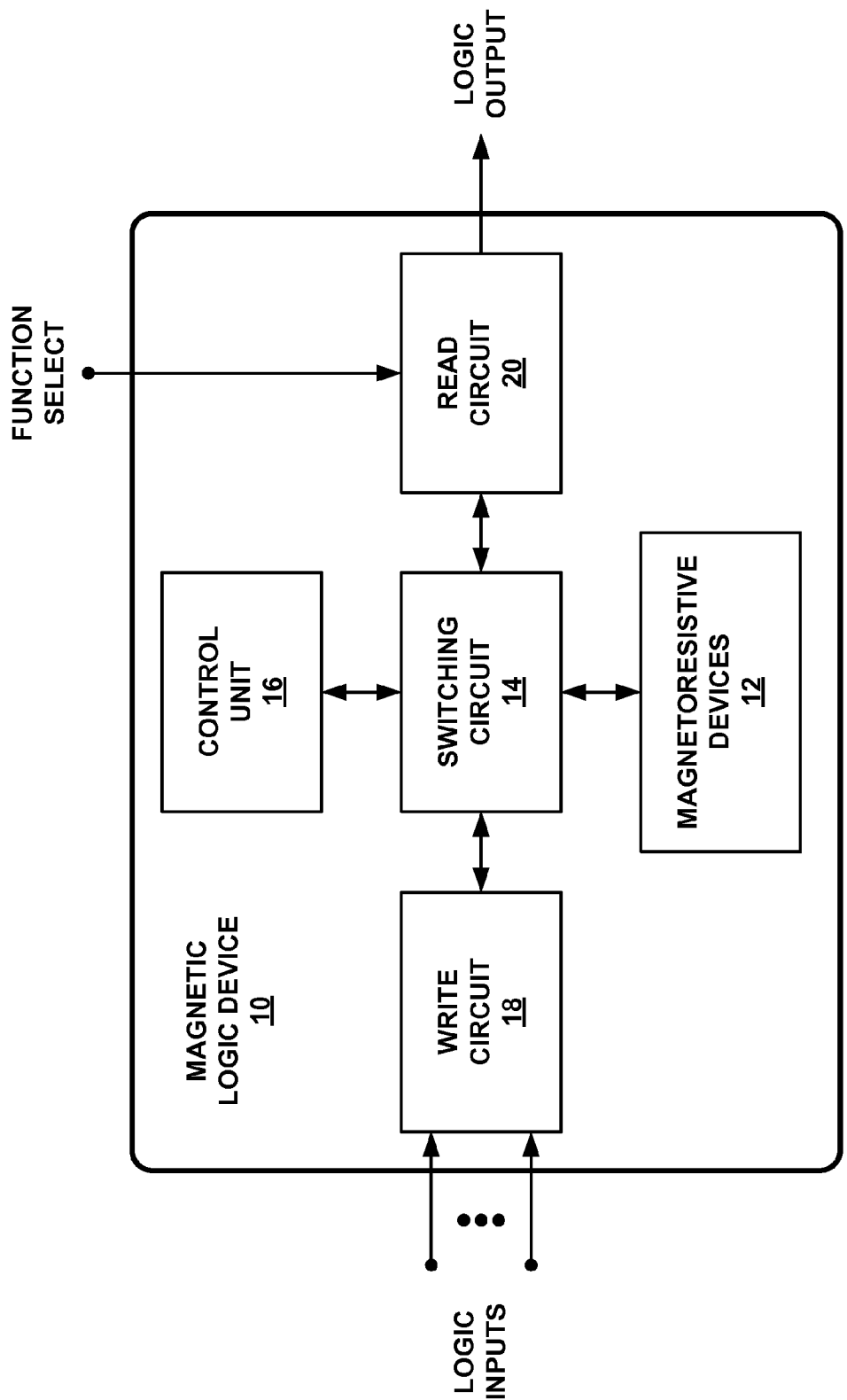
FIG. 1 is a block diagram illustrating an example magnetic logic device according to this disclosure.

FIG. 1 is a block diagram illustrating an example magnetic logic device 10 according to this disclosure. Magnetic logic device 10 is configured to receive two or more logic input values, and generate a logic output value in response to receiving the logic input values. Magnetic logic device 10 may perform a logic operation on the logic input values to generate the logic output value, such as, e.g., applying a combinational logic function to the logic input values to generate the logic output value. Magnetic logic device 10 may also be referred to herein as a "magnetic logic gate." Magnetic logic device 10 includes magnetoresistive devices 12, a switching circuit 14, a control unit 16, a write circuit 18, and a read circuit 20.

Magnetoresistive devices 12 may include two or more individual magnetoresistive devices. In some examples, magnetoresistive devices 12 may include an individual magnetoresistive device corresponding to each of the two or more logic input values of magnetic logic device 10. Each of the magnetoresistive devices may be configured to store a binary value as a magnetization state within the respective magnetoresistive device, and to vary the resistance between two terminals of the magnetoresistive device based on the magnetization state of magnetoresistive device. Because of the magnetization state-dependant resistances of magnetoresistive devices 12, when a voltage is applied across the terminals of a magnetoresistive device, a current may propagate through the magnetoresistive device having a magnitude that is indicative of the magnetization state of the magnetoresistive device.

Each of the magnetoresistive devices 12 may operate in a parallel magnetization state or an anti-parallel magnetization state. If a magnetoresistive device is operating in a parallel magnetization state, then the magnetoresistive device may have a relatively low resistance between the terminals of the magnetoresistive device. Thus, the parallel magnetization state may be alternatively referred to herein as a "low resistance state." Similarly, if the magnetoresistive device is operating in an anti-parallel magnetization state, then the magnetoresistive device may have a relatively high resistance between the terminals of magnetoresistive device. As such, the anti-parallel magnetization state may be alternatively referred to herein as a "high resistance state."

Each of the magnetoresistive devices 12 may be any device that is capable of storing a binary logic value as one of at least two different magnetization states. In some examples, magnetoresistive devices 12 may be magnetoresistive sandwich devices each having two outer ferromagnetic layers and an intermediate layer formed between the two outer ferromagnetic layers. For example, magnetoresistive devices 12 may be giant magnetoresistance (GMR) devices, and the intermediate layer may be a non-ferromagnetic conductive layer. In further examples, magnetoresistive devices may be magnetic tunnel junction (MTJ) devices or tunneling magnetoresistance (TMR) devices, and the intermediate layer may be an insulating barrier layer. The individual magnetoresistive devices within magnetoresistive devices 12 may be, but need not be, the same type of magnetoresistive device.

Magnetoresistive devices 12 may be electrically coupled to switching circuit 14. Depending on the state of switching circuit 14, magnetoresistive devices 12 may also be electrically coupled to write circuit 18 and/or read circuit 20.

According to this disclosure, magnetoresistive devices 12 may be arranged to form an electrical network of magnetoresistive devices. The electrical network may vary depending on whether magnetic logic device 10 is operating in a write configuration or a read configuration. When magnetic logic device 10 is operating in a write configuration, each of the magnetoresistive devices in the network of magnetoresistive devices may be electrically coupled to a respective spin polarizer cell within write circuit 18. When magnetic logic device 10 is operating in a read configuration, the magnetoresistive devices may be electrically coupled in parallel to form a network of at least two magnetoresistive devices electrically coupled in parallel.

Switching circuit 14 is configured to switch magnetic logic device 10 between a write configuration and a read configuration depending on the current operating state of magnetic logic device 10. In some examples, switching magnetic logic device 10 between a write configuration and a read configuration may include switching magnetoresistive devices 12 between a write configuration and a read configuration. Switching circuit 14 may switch magnetic logic gate 10 to a particular configuration (e.g., a write configuration or a read configuration) based on control information (e.g., a control signal) received from control unit 16.

When switching circuit 14 switches magnetic logic device 10 into the write configuration, switching circuit 14 may couple write circuit 18 to magnetoresistive devices 12, and in some examples, decouple read circuit 20 from magnetoresistive devices 12. In addition, switching circuit 14 may switch magnetoresistive devices 12 into a write configuration. For example, switching circuit 14 may decouple the individual magnetoresistive devices 12 in the network of magnetoresistive devices 12 from each other such that the magnetoresistive devices 12 are not electrically coupled in parallel.

When switching circuit 14 switches magnetic logic device 10 into the read configuration, switching circuit 14 may couple read circuit 20 to magnetoresistive devices 12, and in some examples, decouple write circuit 18 from magnetoresistive devices 12. In addition, switching circuit 14 may switch magnetoresistive devices 12 into a read configuration. For example, switching circuit 14 may couple the individual magnetoresistive devices 12 to each other such that the magnetoresistive devices 12 form a network of magnetoresistive devices electrically coupled in parallel.

In further examples, in addition to or in lieu of coupling and decoupling write circuit 18 and read circuit 20 to magnetoresistive devices 12, switching circuit 14 may power-up write circuit 18 and power-down read circuit 20 as part of switching magnetic logic device 10 into a write configuration. Similarly, switching circuit 14 may power-down write circuit 18 and power-up read circuit 20 as part of switching magnetic logic device 10 into a read configuration.

Switching circuit 14 may be electrically coupled to write circuit 18, read circuit 20, and/or magnetoresistive devices 12. Switching circuit 14 may also be communicatively coupled to control unit 16.

Control unit 16 is configured to control the operation of magnetic logic device 10. In some examples, control unit 16 may be configured to cause write circuit 18 to program the magnetization states of magnetoresistive devices 12 such that the resulting programmed magnetization states correspond to respective logic input values of a combinational logic function implemented by magnetic logic device 10, and to cause, in response to causing write circuit 18 to program the magnetization states, read circuit 20 to generate a logic output value for the combinational logic function based on the programmed magnetization states of magnetoresistive devices 12.

Control unit 16 may provide control information to switching circuit 14 for controlling the configuration of magnetic logic gate 10. For example, control unit 16 may be implemented, in some examples, as a state machine having two or more states. When control unit 16 is within a first state (e.g., a "Write" state), control unit 16 may provide control information to switching circuit 14 directing switching circuit 14 to switch magnetic logic device 10 into a write configuration. When control unit 16 is within a second state (e.g., a "Read" state), control unit 16 may provide control information to switching circuit 14 directing switching circuit 14 to switch magnetic logic device 10 into a read configuration.

In some examples, magnetic logic device 10 may transition from the first state to the second state as part of the performance of a single logic operation, i.e., as part of the generation of a logic output value for the two or more logic input values. Automatically transitioning from the first state to the second state may, in some examples, refer to transitioning from the first to the second state based on an internal clock signal. Automatically transitioning from the first state to the second state may, in additional examples, refer to transitioning from the first to the second state based on a timing signal received from a device external to magnetic logic device 10 that directs control unit 16 to initiate the transition from one state to another state. Automatically transitioning from the first state to the second state may include automatically transitioning to one or more intermediate states between the first state and the second state.

Control unit 16 may be configured, in some examples, to transition to a third state (e.g., an "Idle" state) between logic operations and/or in response to a signal received from a device external to magnetic logic device 10. In such examples, control unit 16 may transition from the third state (e.g., "Idle" state) to the first state (e.g., "Write" state) in response to receiving an external signal directing magnetic logic gate 10 to initiate the performance of a logic operation.

The control information provided by control unit 16 may be indicative of the current operating state of control unit 16. For example, the control information may take the form of a combination of one or more bits with each bit combination corresponding to a respective state within control unit 16.

In some examples, control unit 16 may be implemented as a state machine. In further examples, control unit 16 may route an external control input directly to switching circuit 14 without additional circuitry. In such examples, an external device that generates the external control input may control the current state of switching circuit 14. Control unit 16 is communicatively coupled to switching circuit 14.

Write circuit 18 is configured to receive two or more logic input values for a combinational logic function, and to program magnetoresistive devices 12 such that a resulting programmed magnetization state for each of the magnetoresistive devices 12 corresponds to a respective logic input value of the combinational logic function. Write circuit 18 is electrically coupled to switching circuit 14 and to the logic input terminals of magnetic logic gate 10. In addition, when magnetic logic gate 10 has been switched into a write configuration, write circuit 18 may also be electrically coupled to magnetoresistive devices 12.

In some examples, write circuit 18 may be configured to program the magnetization states of magnetoresistive devices 12 by generating a plurality of spin-polarized currents with each spin-polarized current having a spin direction that corresponds to a respective logic input value of the combinational logic function. For example, for each logic input value, write circuit 18 may generate a spin-polarized current having a first spin direction (e.g., a spin-down direction) when the respective logic input value is a logic zero (i.e., a binary "0"). Similarly, write circuit 18 may generate a spin-polarized current having a second spin direction (e.g., a spin-up direction) when the respective logic input value is a logic one (i.e., a binary "1"). The second spin direction may be a spin direction that is opposite that of the first spin direction. Write circuit 18 may use one or more direction-specific spin filters to generate the spin-polarized currents.

Write circuit 18 may apply the spin-polarized currents to magnetoresistive devices 12 to program the magnetization states of magnetoresistive devices 12 such that a resulting programmed magnetization state of each of the magnetoresistive devices 12 corresponds to a respective logic input value of the combinational logic function. In some examples, for one or more of the logic input values, write circuit 18 may apply a respective spin-polarized current to a first terminal of a respective magnetoresistive device that is electrically coupled to a free ferromagnetic layer of the magnetoresistive device. In additional examples, for one or more of the logic input values, write circuit 18 may apply a respective spin-polarized current to a second terminal of a respective magnetoresistive device that is electrically coupled to a fixed ferromagnetic layer of the magnetoresistive device. In any case, the application of the spin-polarized currents to magnetoresistive devices 12 programs the magnetization states of each of magnetoresistive devices 12 to one of two magnetization states based on the spin direction of the spin-polarized current. This technique of programming the magnetization states of magnetoresistive devices 12 may be referred to as a "spin torque transfer (STT)" technique.

In additional examples, write circuit 18 may use other techniques for programming the magnetization states of magnetoresistive devices 12. For example, write circuit 18 may use inductive techniques to program the magnetization states. In such examples, write circuit 18 may apply a write current to a write current structure situated proximate to the free layer of a magnetoresistive device. The write current need not necessarily be spin-polarized as described in the previous example. The electron-flow direction for a particular write current may be dependent on the logic input value for a respective logic input. For example, if the logic input value is a logic zero, then the electron-flow direction of the current may be negative. Otherwise, if the logic input value is a logic one, then the electron-flow direction of the current may be positive.

The write current structure may be configured to inductively program the magnetization state of the corresponding magnetoresistive device by producing a magnetic field having one of two magnetic field directions depending on the electron-flow direction of the current. The magnetic field causes the magnetization direction of the free layer to situate in one of two directions, and hence, programs the magnetization state of the magnetoresistive device.

Read circuit 20 is configured to generate a logic output value for a combinational logic function implemented by magnetic logic device 10 based on the programmed magnetization states of magnetoresistive devices 12. In some examples, read circuit 20 may also select a particular logic function from a set of logic functions for application to the logic inputs based on the function select input received by magnetic logic gate 10.

According to this disclosure, when magnetic logic device 10 is operating in the read configuration, magnetoresistive devices 12 may be electrically coupled in parallel to form a network of magnetoresistive devices electrically coupled in parallel. Read circuit 20 may be configured to apply a bias voltage across the network of magnetoresistive devices. For example, read circuit 20 may apply a voltage between a first terminal at a first end of the network of magnetoresistive devices and a second terminal at a second end of the network of magnetoresistive devices. The first terminal of the network of magnetoresistive devices may be electrically coupled to respective first terminals of each of the magnetoresistive devices. The second terminal of the network of magnetoresistive devices may be electrically coupled to respective second terminals of each of the magnetoresistive devices. The second terminals of each of the magnetoresistive devices may be electrically coupled to a ferromagnetic layer of the respective magnetoresistive device opposite the ferromagnetic layer to which the first terminal for the respective magnetoresistive device is electrically coupled.

The applied voltage may induce branch currents to propagate through the individual magnetoresistive devices. Because the magnetoresistive devices are electrically coupled in parallel, the branch currents combine to produce an aggregate read current at the first and second terminals of the network. The magnitude of the read current may be dependent upon each of the magnetization states in the network of magnetoresistive devices. Read circuit 20 may be configured to generate a logic output value based on the magnitude of the read current. For example, read circuit 20 may compare the magnitude of the read current to a threshold to determine a logic output value for a particular logic function.

In some examples, magnetic logic device 10 may perform a predetermined logic function. In such examples, read circuit 20 may compare the magnitude of the read current to a predetermined threshold value corresponding to the predetermined logic function to determine the logic output value.

In further examples, magnetic logic device 10 may perform a logic function that is selected from a predetermined set of logic functions. In such examples, read circuit 20 may be configured to receive a function select parameter, and to select a logic function from a predetermined group of logic functions based on the function select parameter. Read circuit 20 may select a threshold value corresponding to the selected logic function, and compare the magnitude of the read current to the selected threshold value to determine the logic output value. In some examples, the selected logic function may correspond to two or more different thresholds and the comparison may involve making two or more comparisons to the respective two or more thresholds.

The predetermined set of logic functions may include logic functions, such as, e.g., an AND logic function, an OR logic function, a NAND logic function, a NOR logic function, an XOR logic function, an XNOR logic function, and/or a VOTING-OR logic function. A voting-OR logic function may produce a logic one output value if the number of logic inputs having a value of logic one is greater than a selected threshold for the function. Otherwise, the voting-OR logic function may produce a logic zero output value.

In any case, read circuit 20 is configured to map the read current magnitude to a corresponding logic output value to generate a logic output value for the logic function. The logic output value may be a binary value (i.e., a logic one or logic zero) indicative of the result obtained from applying the selected logic function to the logic input values.

Read circuit 20 may include voltage sources, current measurement devices, operational amplifiers, transimpedance amplifiers, comparators, digital-to-analog converters, and/or other circuitry configured to generate a read current and map the read current magnitude to a logic output value.

Read circuit 20 is electrically coupled to switching circuit 14. In addition, when magnetic logic gate 10 has been switched into a read configuration, read circuit 18 may also be electrically coupled to magnetoresistive devices 12.

The operation of magnetic logic gate 10 will now be described. Control unit 16 initiates a logic operation by transitioning to a first state (e.g., a "Write" state). When operating in the first state, control unit 16 causes magnetic logic device 10 to operate in a write configuration. For example, control unit 16 may provide control information to switching circuit 14 directing switching circuit 14 to switch magnetic logic device 10 into a write configuration.

Upon receiving the control information from control unit 16, switching circuit 14 switches magnetic logic device 10 into a write configuration. For example, switching circuit 14 may couple write circuit 18 to magnetoresistive device 12. Switching circuit may also switch magnetoresistive devices 12 into a write configuration, which in some examples, may include configuring magnetoresistive devices 12 such that the magnetoresistive devices are not electrically coupled to each other in parallel.

Write circuit 18 receives two or more logic input values for a combinational logic function and programs the magnetization states of magnetoresistive devices 12 such that the resulting magnetization states correspond to respective logic input values for the logic function. For example, if the logic function includes two logic input values, write circuit 18 may program the magnetization states of two magnetoresistive devices 12 such that each magnetization state corresponds to a respective one of the logic input values.

After the magnetization states have been programmed to correspond to the logic input values, control unit 16 transitions from the first state (e.g., the "Write" state) to the second state (e.g., the "Read" state). In some examples, control unit 16 may transition to the second state in response to an external timing signal. In further examples, control unit 16 may automatically transition to the second state after a predetermined period of time. When operating in the second state, control unit 16 causes magnetic logic device 10 to switch from operating in the write configuration to operating in a read configuration. For example, in response to operating in the write configuration, control unit 16 may provide control information to switching circuit 14 directing switching circuit 14 to switch magnetic logic device 10 from the write configuration to a read configuration.

Upon receiving the control information from control unit 16, switching circuit 14 switches magnetic logic device 10 into a read configuration. In some examples, switching circuit 14 may decouple write circuit 18 from magnetoresistive device 12, and couple read circuit 20 to magnetoresistive device 12. Switching circuit 14 may also switch magnetoresistive devices 12 into a read configuration, which in some examples, may include configuring magnetoresistive devices 12 such that the magnetoresistive devices are electrically coupled in parallel to form a network of magnetoresistive devices electrically coupled in parallel.

Read circuit 20 generates a logic output value for a logic function based on the programmed magnetization states of magnetoresistive devices 12. The logic function may be a predetermined logic function or selected based on the function select input. In some examples, read circuit 20 may apply a voltage across the network of magnetoresistive devices, which causes a read current to propagate through the network. Portions of the read current may propagate through different branches of the network. The magnitude of the read current varies depending on the programmed magnetization states of magnetoresistive devices 12. Read circuit 20 maps the magnitude of the read current to a logic output value. The logic operation is now complete.

After completing the logic operation, control unit 16 may, in some examples, transition from the second state (e.g., the "Read" state) to the first state (e.g., the "Write" state) to commence performance of a subsequent logic operation. In additional examples, control unit 16 may transition to a third state (e.g., the "Idle" state) to wait until control unit 16 receives instructions from an external device to commence another logic operation.

Figure 2A:
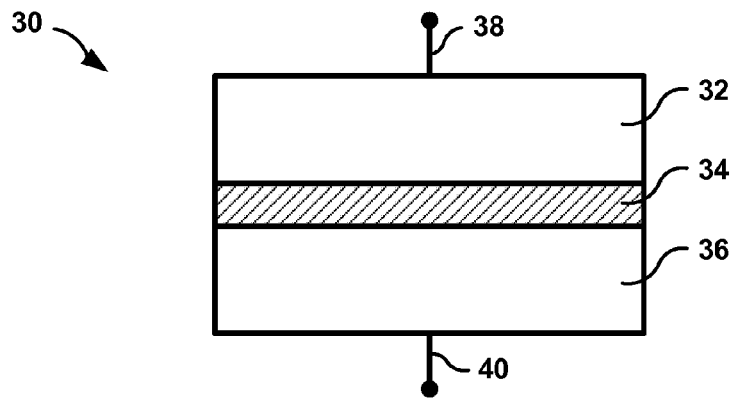
FIG. 2A is a conceptual diagram illustrating an example magnetoresistive device according to this disclosure for use within the magnetic logic devices of this disclosure.

FIG. 2A is a conceptual diagram illustrating an example magnetoresistive device 30 for use within any of the magnetic logic devices of this disclosure. Magnetoresistive device 30 is configured to vary a terminal-to-terminal resistance based on a magnetization state of the magnetoresistive device. Magnetoresistive device 30 may also be configured to receive a spin-polarized current and to transition or remain in a magnetization state corresponding to the spin direction of the spin-polarized current. In addition, magnetoresistive device 30 may be configured to receive an applied voltage across the terminals of magnetoresistive device 30 and generate a current having a magnitude that is indicative of the magnetization state of magnetoresistive device 30 in response to the applied voltage. Magnetoresistive device 30 includes a free layer 32, an intermediate layer 34, a fixed layer 36, and terminals 38, 40.

Free layer 32 includes ferromagnetic materials, such as, e.g., nickel, iron, cobalt, binary and ternary alloys of Ni, Fe, and Co, permalloys, or any other material that has ferromagnetic properties. Fixed layer 36 includes ferromagnetic materials, such as, e.g., nickel, iron, cobalt, nickel alloys, iron alloys, cobalt alloys, permalloys, or any other material that has ferromagnetic properties. Antiferromagnetic materials may also be applied, such as iron manganese and other manganese alloys. In some examples, free layer 32 and fixed layer 36 may include thin-film ferromagnetic materials. Although free layer 32 and fixed layer 36 are described in the example magnetoresistive device 30 of FIG. 2A as including ferromagnetic materials, in other examples, one or more of free layer 32 and fixed layer 36 may include ferrimagnetic materials in addition to or in lieu of the ferromagnetic materials.

Free layer 32 is configured to have a magnetization direction that can be altered by application of a spin-polarized current to one or both of terminals 38, 40. Fixed layer 36 is configured to have a magnetization direction that is substantially fixed during the performance of logic operations. Fixed layer 36 may alternatively be referred to as a pinned layer.

In order to achieve the desired behaviors for free layer 32 and fixed layer 36, a first type of ferromagnetic material may be selected for free layer 32, and a second type of ferromagnetic material may be selected for fixed layer 36. For example, the ferromagnetic material selected for fixed layer 36 may require a higher magnitude of spin-polarized current to alter the magnetization direction of the material than the magnitude of spin-polarized current required to alter the magnetization direction of the ferromagnetic material selected for free layer 32. As another example, the ferromagnetic material selected for fixed layer 36 may require a higher device temperature to alter the magnetization direction of the material than the device temperature required to alter the magnetization direction of the ferromagnetic material selected for free layer 32.

Intermediate layer 34 is disposed between free layer 32 and fixed layer 36. In some examples, magnetoresistive device 30 may take the form of a giant magnetoresistance (GMR) device. In such examples, intermediate layer 34 may be referred to as a non-ferromagnetic conductive layer or a non-ferromagnetic spacer layer. The non-ferromagnetic layer may include non-ferromagnetic conductor materials, such as, e.g., copper, chromium, aluminum, respective alloys of the preceding metals, or the like.

In additional examples, magnetoresistive device 30 may take the form of a magnetic tunnel junction (MTJ) device and/or a tunneling magnetoresistance (TMR) device. In such examples, intermediate layer 34 may be referred to as an insulating layer or a tunnel barrier layer. The insulating layer may include insulating materials, such as, e.g., aluminum oxide, magnesium oxide, other types of oxides, a nitride, or any other material having insulating properties.

Terminal 38 is electrically coupled to free layer 32, and in some examples, may be in direct contact with free layer 32. Terminal 40 is electrically coupled to fixed layer 36, and in some examples, may be in direct contact with fixed layer 36. As used herein, terminal 38 may be referred to as a "free layer terminal" and terminal 40 may be referred to as a "fixed layer terminal."

As used herein, the magnetization state of magnetoresistive device 30 may refer to whether the device is configured in a parallel magnetization state or an anti-parallel magnetization state. The magnetization state of magnetoresistive device 30 is defined by the relative orientation of the magnetization directions of free layer 32 and fixed layer 36. The magnetization direction of each of free layer 32 and fixed layer 36 may refer to the direction of the magnetic moment of the ferromagnetic material for the respective layer. When the magnetization directions (i.e., magnetic moments) of free layer 32 and fixed layer 36 are aligned in the same direction, then magnetoresistive device 30 is said to be in a parallel magnetization state, or alternatively, a low resistance state. When the magnetization directions (i.e., magnetic moments) of free layer 32 and fixed layer 36 are oriented in opposite directions (i.e., not aligned in the same direction), then magnetoresistive device 30 is said to be in an anti-parallel magnetization state, or alternatively, a high resistance state.

When multiple instances of magnetoresistive device 30 are used to form a network of magnetoresistive devices, the terminals of adjacent magnetoresistive devices may be electrically coupled to each other. For example, a free layer terminal 38 of a first magnetoresistive device in the network may be electrically coupled to a free layer terminal 38 of a second magnetoresistive device in the network, and a fixed layer terminal 40 of the first magnetoresistive device may be electrically coupled to a fixed layer terminal 40 of the second magnetoresistive. As another example, a free layer terminal 38 of a first magnetoresistive device in the network may be electrically coupled to a fixed layer terminal 40 of a second magnetoresistive device in the network, and a fixed layer terminal 40 of the first magnetoresistive device may be electrically coupled to a free layer terminal 38 of the second magnetoresistive device.

Figure 2B:
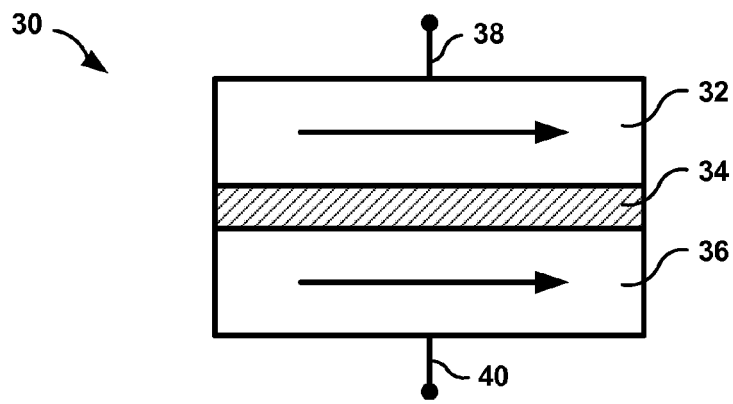
FIG. 2B is a conceptual diagram illustrating the example magnetoresistive device of FIG. 2A in a parallel magnetization state according to this disclosure.

FIG. 2B is a conceptual diagram illustrating the example magnetoresistive device 30 of FIG. 2A in a parallel magnetization state according to this disclosure. In FIG. 2B, free layer 32 and fixed layer 36 each have an arrow representative of the magnetization direction of the layers. As shown in FIG. 2B, the arrows point in the same direction representing that the magnetization direction of free layer 32 is the same as the magnetization direction of fixed layer 36, which means that magnetoresistive device 30 is in a parallel magnetization state.

Figure 2C:
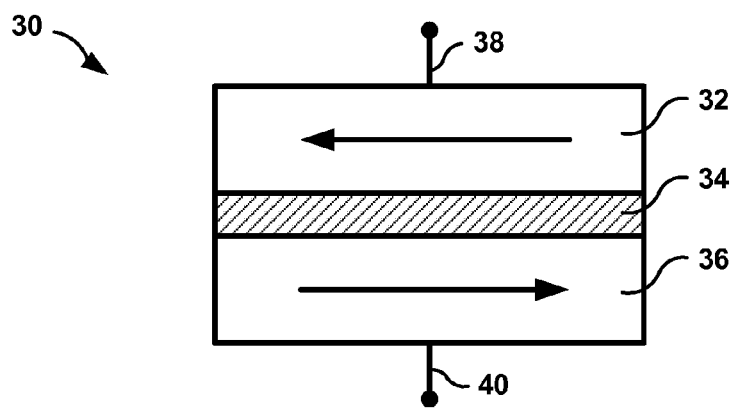
FIG. 2C is a conceptual diagram illustrating the example magnetoresistive device of FIG. 2A in an anti-parallel magnetization state according to this disclosure.

FIG. 2C is a conceptual diagram illustrating the example magnetoresistive device of FIG. 2A in an anti-parallel magnetization state according to this disclosure. FIG. 2C includes arrow representative of the magnetization direction of the layers similar to that depicted in FIG. 2B except that the arrows are oriented in opposite directions, which means the that magnetoresistive device 30 is in an anti-parallel magnetization state.

If magnetoresistive device 30 is a GMR device, then a parallel magnetization state may cause less electron scattering at the interfaces and longer mean free paths for the electrons as compared to the anti-parallel magnetization state. The reduced electron scattering and increased mean free paths effectively cause a reduction in the resistance between terminals 38 and 40 (i.e., a low resistance state). Similarly, when the GMR device is in an anti-parallel magnetization state, electron scattering may increase, and mean free paths for the electrons may decrease causing an increase in the resistance between terminals 38 and 40 (i.e., a high resistance state).

If magnetoresistive device 30 is an MTJ or TMR device, then a parallel magnetization state may increase the likelihood of electrons tunneling through barrier layer 34. The increased likelihood of tunneling effectively causes a reduction in the resistance between terminals 38 and 40 (i.e., a low resistance state). Similarly, when the MTJ or TMR device is in an anti-parallel magnetization state, the likelihood of electrons tunneling through barrier layer 34 may decrease thereby causing an increase in the resistance between terminals 38 and 40 (i.e., a high resistance state).

In some examples, the magnetization direction of free layer 32, and consequently, the magnetization state of magnetoresistive device 30 may be altered by applying a spin-polarized current having a particular spin direction to one or both of terminals 38 and 40. If the spin direction of the spin-polarized current is in a first direction (e.g., spin-up), then the magnetization direction of free layer 32 may be set to a first direction (e.g., parallel). If the spin direction of the spin-polarized current is in a second direction (e.g., spin-down), then the magnetization direction of free layer 32 may be set to a second direction (e.g., anti-parallel). In additional examples, the magnetization direction of free layer 32 may be altered using known techniques, such as, e.g., inductive techniques.

The techniques in this disclosure are not limited to the use of magnetoresistive devices as shown and described above with respect to FIGS. 2A-2C. Other types of magnetoresistive devices may also be used to implement the techniques of this disclosure.

Figure 3:
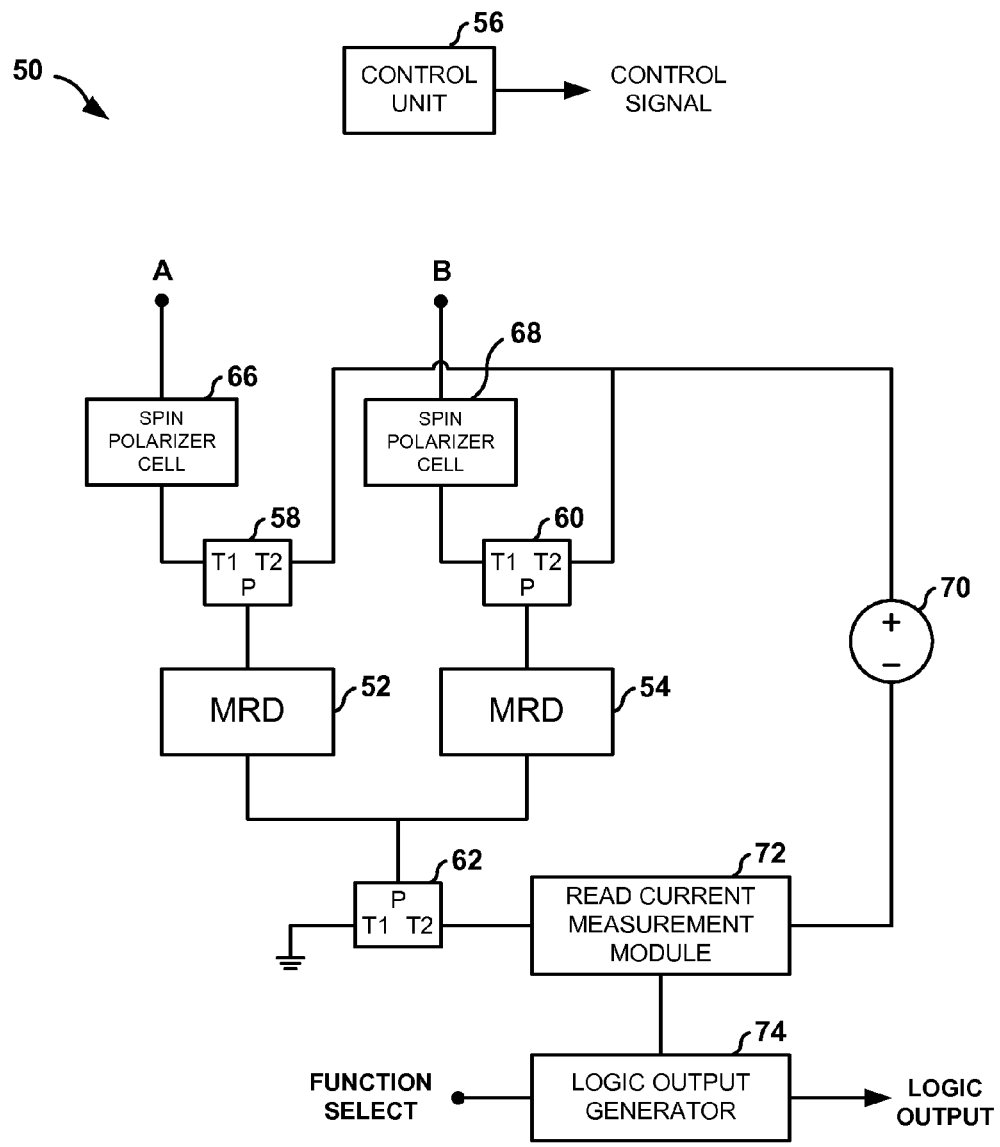
FIG. 3 is a schematic diagram illustrating an example two-input magnetic logic device according to this disclosure.

FIG. 3 is a schematic diagram illustrating an example two-input magnetic logic device 50 according to this disclosure. Magnetic logic device 50 is configured to receive two logic input values, and to generate a logic output value in response to receiving the logic input values. Magnetic logic device 50 may perform a logic operation on the logic input values to generate the logic output value, such as, e.g., applying a two-input combinational logic function to the logic input values to generate the logic output value. In some examples, magnetic logic device 50 may be used to form magnetic logic device 10 illustrated in FIG. 1. Magnetic logic device 50 includes magnetoresistive devices (MRDs) 52, 54, a control unit 56, switching modules 58, 60, 62, spin polarizer cells 66, 68, a bias voltage source 70, a read current measurement module 72, and a logic output generator 74.

In some examples, MRDs 52, 54 may correspond to magnetoresistive devices 12 described above with respect to FIG. 1. When operating in the read configuration, MRDs 52, 54 may form a network of magnetoresistive devices electrically coupled in parallel. Switching modules 58, 60, 62 may be used to form switching circuit 14 described above with respect to FIG. 1. In further examples, spin polarizer cells 66, 68 may be used to form write circuit 18 described above with respect to FIG. 1. In more examples, bias voltage source 70, read current measurement module 72, and logic output generator 74 may be used to form read circuit 20 described above with respect to FIG. 1.

Control unit 56 is configured to control the configuration and operation of magnetic logic device 50. Control unit 56 is electrically coupled to switching modules 58, 60, 62 and provides a control signal to switching modules 58, 60, 62 for controlling the switching state of switching modules 58, 60, 62 and magnetic logic device 50. The operation of control unit 56 may be substantially similar to the operation of control unit 16 described above with respect to FIG. 1, and thus will not be described in further detail in the interest of brevity and to avoid redundancy.

MRDs 52, 54 are each configured to store a binary value as a magnetization state, and to vary the resistance between the two terminals of the respective MRD based on the magnetization state the MRD. MRDs 52, 54 may be implemented as any type of magnetoresistive device. For example, MRDs 52, 54 may be any combination of GMR, TMR, and/or MTJ devices in accordance with the example magnetoresistive device 30 illustrated in FIGS. 2A-2C. A first terminal of MRD 52 is electrically coupled to switching module 58, and a second terminal of MRD 52 is electrically coupled to switching module 62. Similarly, a first terminal of MRD 54 is electrically coupled to switching module 60, and a second terminal of MRD 54 is electrically coupled to switching module 62.

The free layer and fixed layer of MRDs 52, 54 may be oriented in several possible orientations. In some examples, switching modules 58, 60 may be electrically coupled to respective free layer terminals 38 of MRDs 52, 54, and switching module 62 may be electrically coupled to respective fixed layer terminals 40 of MRDs 52, 54. In additional examples, switching modules 58, 60 may be electrically coupled to respective fixed layer terminals 40 of MRDs 52, 54, and switching module 62 may be electrically coupled to respective free layer terminals 38 of MRDs 52, 54. In further examples, switching module 58 may be electrically coupled to a free layer terminal 38 of MRD 52, switching module 60 may be electrically coupled to a fixed layer terminal 40 of MRD 54, and switching module 62 may be electrically coupled to a fixed layer terminal 40 of MRD 52 and a free layer terminal 38 of MRD 54. In more examples, switching module 58 may be electrically coupled to a fixed layer terminal 40 of MRD 52, switching module 60 may be electrically coupled to a free layer terminal 38 of MRD 54, and switching module 62 may be electrically coupled to a free layer terminal 38 of MRD 52 and a fixed layer terminal 40 of MRD 54.

Control unit 56 is configured to provide a control signal indicative of the current operating state of magnetic logic device 50. The control signal may be used to control the configuration of switching modules 58, 60, 62. The control signal may be a single bit indicating either a "Write" state (e.g., logic zero) or a "Read" state (e.g., logic one). Control unit 56 is communicatively coupled to switching modules 58, 60, 62.

Switching modules 58, 60, 62 are configured to receive the control signal from control unit 56, and to configure magnetic logic device 50 into a write configuration or a read configuration based on the control signal. Switching modules 58, 60, 62 are each communicatively coupled to control unit 56.

Switching module 58 includes a first throw (T1) terminal that is electrically coupled to a spin-polarized current output terminal of spin polarizer cell 66, a second throw (T2) terminal that is electrically coupled to a positive terminal of bias voltage source 70, and a pole (P) terminal that is electrically coupled to a first terminal of MRD 52. Switching module 60 includes a first throw (T1) terminal that is electrically coupled to a spin-polarized current output terminal of spin polarizer cell 68, a second throw (T2) terminal that is electrically coupled to a positive terminal of bias voltage source 70, and a pole (P) terminal that is electrically coupled to a first terminal of MRD 54. Switching module 62 includes a T1 terminal that is electrically coupled to a ground terminal, a T2 terminal that is electrically coupled to a first terminal of read current measurement module 72, and a P terminal that is electrically coupled to second terminals of MRDs 52, 54. Although the T1 terminal of switching module 62 is depicted in the example magnetic logic device 50 of FIG. 3 as being directly coupled to the ground terminal, in other examples, any number of intervening components and/or load networks may be placed between the ground terminal and the T1 terminal of switching module 62.

If the control signal indicates that the current operating state for magnetic logic device 50 is a "Write" state, then switching modules 58, 60, 62 may electrically couple the respective T1 terminals to respective P terminals for each of switching modules 58, 60, 62 and decouple respective T2 terminals from the respective P terminals for each of switching modules 58, 60, 62 thereby placing magnetic logic device 50 into a write configuration. On the other hand, if the control signal indicates that the current state for magnetic logic device 50 is a "Read" state, then switching modules 58, 60, 62 may electrically couple the respective T2 terminals to respective P terminals for each of switching modules 58, 60, 62 and decouple respective T1 terminals from respective P terminals for each of switching modules 58, 60, 62 thereby placing magnetic logic device 50 into a read configuration.

Spin polarizer cells 66, 68 are each configured to receive a respective logic input value for a combinational logic function, and to generate a respective spin-polarized current having a spin direction that corresponds to the logic input value. Spin polarizer cell 66 may generate a spin-polarized current at a spin-polarized current output terminal that is electrically coupled to the T1 terminal of switching module 58. Similarly, spin polarizer cell 68 may generate a spin-polarized current at a spin-polarized current output terminal that is electrically coupled to the T1 terminal of switching modules 60. Spin polarizer cells 66, 68 may apply the spin-polarized current to MRDs 52, 54, respectively, to program the magnetization states of MRDs 52, 54 when magnetic logic device 50 is operating in a "Write" state.

Bias voltage source 70 is configured to apply a bias voltage across MRDs 52, 54 when magnetic logic device 50 is operating in a "Read" state. As shown in FIG. 3, read current measurement module 72 may propagate the voltage applied by bias voltage source 70 to the second terminals of MRDs 52, 54. The bias voltage may induce a read current to flow through the network of MRDs.

In some examples, the magnitude of the read current may be less than the magnitude of the spin-polarized current applied to MRDs 52, 54 by spin-polarizer cells 66, 68. In further examples, the magnitude of the read current may be less than the minimum magnitude of current needed to change the magnetization state of MRDs 52, 54. Because the resistance of each of MRDs 52, 54 is dependent upon the magnetization state of the respective MRD, the magnitude of the resulting read current is also dependent on the magnetization states of both of MRDs 52, 54.

Bias voltage source 70 includes a first terminal (e.g., a positive terminal) that is electrically coupled to the T2 terminal of switching modules 58 and 60, and a second terminal (e.g., a negative terminal) that is electrically coupled to a second terminal of read current measurement module 72. Bias voltage source 70 may be configured to regulate the voltage between the first and second terminals at a constant voltage.

It should be noted that the configuration of bias voltage source 70 illustrated in magnetic logic device 50 of FIG. 3 is merely one example. In general, bias voltage source 70 may have positive and negative terminals configured in any manner that allows for a bias voltage to be applied across each of MRDs 52 and 54. For example, the negative terminal of bias voltage source 70 may be electrically coupled to a conductor located between read current measurement module 72 and one or both of MRDs 52 and 54. As another example, the positive and negative terminals of bias voltage source 70 may be electrically coupled to opposite terminals of each of MRDs 52 and 54 such that the bias voltage is not applied through switches 58, 60 and 62. Other examples are also possible.

Read current measurement module 72 is configured to generate an electrical signal indicative of a magnitude of read current induced in MRDs 52, 54 in response to the voltage applied by bias voltage source 70. The electrical signal may be either a current-mode signal or a voltage-mode signal having a magnitude that is dependent on the programmed magnetizations state of both of MRDs 52, 54.

In some examples, the electrical signal may be the read current itself. In additional examples, read current measurement module 72 may perform current-to-voltage conversion on the read current to provide a voltage-mode signal having a magnitude indicative of the magnitude of the read current. For example, read current measurement module 72 may include a transimpedance amplifier that is configured to generate a voltage-mode signal having a voltage magnitude that is dependent on the magnetization states of MRDs 52, 54. In such examples, the current-to-voltage converter may be electrically coupled in series with bias voltage source 70.

Read current measurement module 72 includes a first terminal that is electrically coupled to the T2 terminal of switching module 62, and a second terminal that is electrically coupled to a negative terminal of bias voltage source 70. Read current measurement module 72 may be configured to measure the current fed into the first terminal of read current measurement module 72, which may correspond to the read current generated by the network of MRDs 52, 54. Read current measurement module 72 also includes a third terminal that is electrically coupled to logic output generator 74 and configured to provide the electrical signal indicative of the magnitude of the read current to logic output generator 74.

In some examples, read current measurement module 72 may provide the read current directly to logic output generator 74. In other examples, read current measurement module 72 may convert the read current to a voltage-mode signal having a voltage magnitude indicative of the magnetization state of MRDs 52, 54, and provide the voltage mode signal to logic output generator 74.

Logic output generator 74 is configured to receive an electrical signal indicative of the magnitude of the read current from read current measurement module 74, and generate a logic output value for a combinational logic function based on the electrical signal. The logic output value corresponds to a logic value (e.g., a binary one or zero) obtained when the combinational logic function is applied to the logic input values. Logic output generator 74 is electrically coupled to read current measurement module 72.

Logic output generator 74 may, in some examples, include an analog-to-digital converter that is configured to convert the magnitude of the electrical signal into a digital logic output value. For example, the analog-to-digital converter may be implemented as one or more comparators that compare the magnitude of the electrical signal to the magnitude of a reference electrical signal to determine a logic output value.

In some examples, logic output generator 74 may select the combinational logic function implemented by magnetic logic device 50 based on a function select input of magnetic logic device 50. In additional examples, the combinational logic function may be predetermined prior to operation of magnetic logic device 50. In any case, logic output generator 74 generates a logic output value corresponding to the combinational logic function applied to the two logic inputs.

During operation, magnetic logic device 50 switches between a write configuration and a read configuration at the direction of control unit 56. A single logic operation may include writing the two logic input values to MRDs 52, 54, respectively, when magnetic logic device 50 is operating in the write configuration, and generating a logic output value based on the magnetization states of MRDs 52, 54 when magnetic logic device 50 is operating in the read configuration.

Figure 4A:
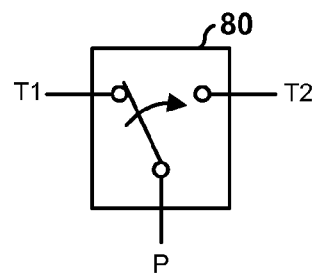
FIGS. 4A and 4B are schematic diagrams illustrating example switching modules for use in the magnetic logic device of FIG. 3 according to this disclosure.
Figure 4B:
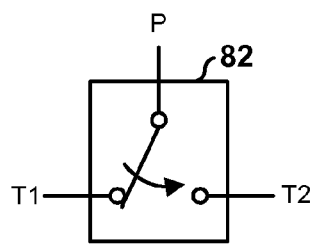

FIGS. 4A and 4B are schematic diagrams illustrating example switching modules 80, 82 for use in the magnetic logic device of FIG. 3 according to this disclosure. As shown in examples of FIGS. 4A and 4B, switching modules 80, 82 are implemented as single-pole double-throw (SPDT) switches. During a first switching state, switching modules 80, 82 electrically couple respective T1 terminals to respective P terminals and decouple respective T2 terminals from respective P terminals. During a second switching state, switching modules 80, 82 electrically couple respective T2 terminals to respective P terminals and decouple respective T1 terminals from respective P terminals. In other examples, switching modules 80, 82 may be implemented as "on-off-on" switches where switching modules 80, 82 may be set to a third switching state that decouples both the T1 terminals from the P terminals and the T2 terminals from the P terminals.

Figure 5:
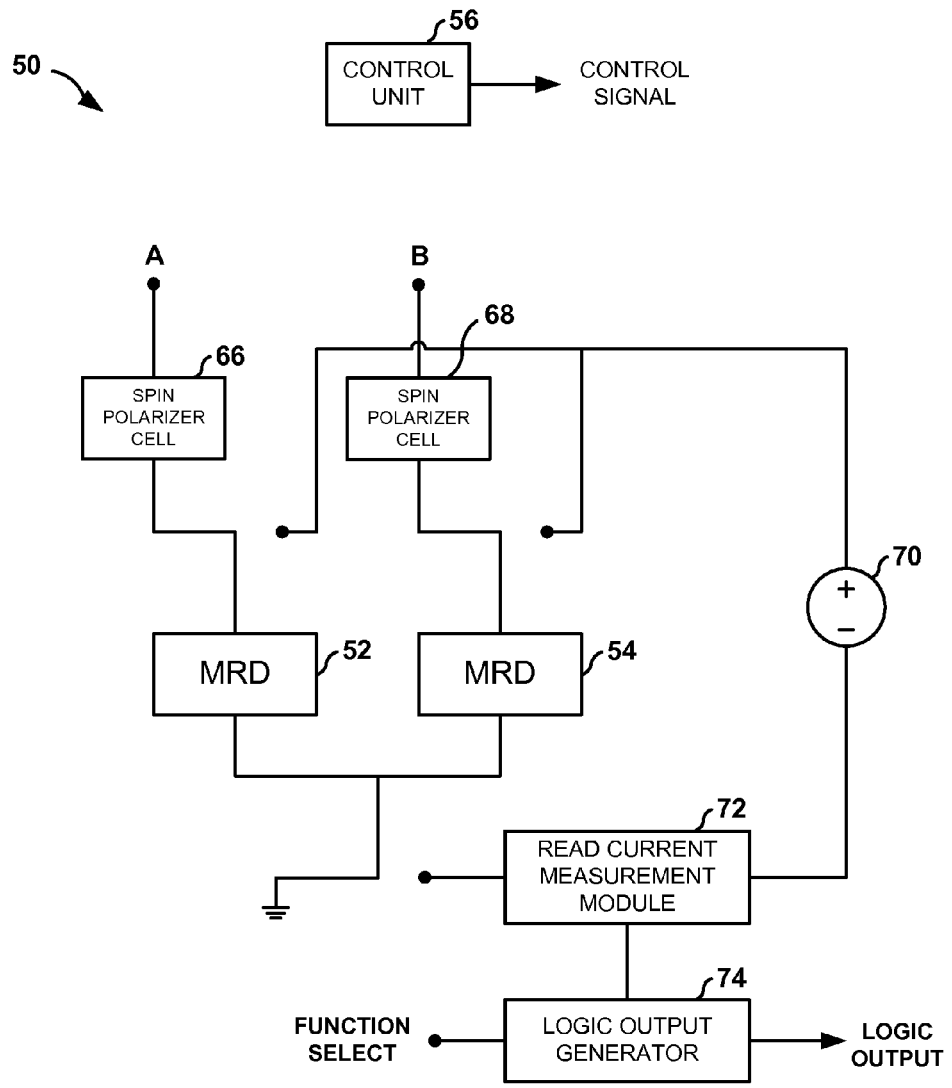
FIG. 5 is a schematic diagram illustrating the magnetic logic device of FIG. 3 configured in a write configuration according to this disclosure.

FIG. 5 is a schematic diagram illustrating the magnetic logic device 50 of FIG. 3 configured in a write configuration according to this disclosure. As shown in FIG. 5, when magnetic logic device 50 is placed in the write configuration, the write circuit is electrically coupled to MRDs 52, 54, and the read circuit is decoupled from MRDs 52, 54. More specifically, the spin-polarized current output terminals of spin-polarizer cells 66, 68 are electrically coupled to first terminals of MRDs 52, 54 respectively, and a ground terminal is electrically coupled to second terminals of MRDs 52, 54. In addition, MRDs 52, 54 may be switched into a write configuration, which may include decoupling MRDs 52, 54 such that the MRDs are not electrically coupled to each other in parallel.

While operating in the write configuration, spin polarizer cell 66 may apply a first spin-polarized current to MRD 52 such that a resulting magnetization state of MRD 52 corresponds to a logic input value for a first logic input (i.e., logic input "A"). Similarly, spin polarizer cell 68 may apply a second spin-polarized current to MRD 54 such that a resulting magnetization state of MRD 54 corresponds to a logic input value for a second logic input (i.e., logic input "B"). As used herein, a magnetization state of an MRD may correspond to a logic input value when the MRD is placed into one of two magnetization states (e.g., parallel vs. anti-parallel) depending on the value of the logic input (e.g., logic "0" or logic "1").

For example, if a first logic input value is a logic zero, spin polarizer cell 66 may generate a spin-polarized current having a first spin direction (e.g., a spin-down spin direction), which when applied to MRD 52, causes the magnetization state to be programmed to a first magnetization state (e.g., an anti-parallel magnetization state). Similarly, if the logic input value is a logic one, spin polarizer cell 66 may generate a spin-polarized current having a second spin direction (e.g., a spin-up spin direction), which when applied to MRD 52, causes the magnetization state to be programmed to a second magnetization state (e.g., a parallel magnetization state).

Figure 6:
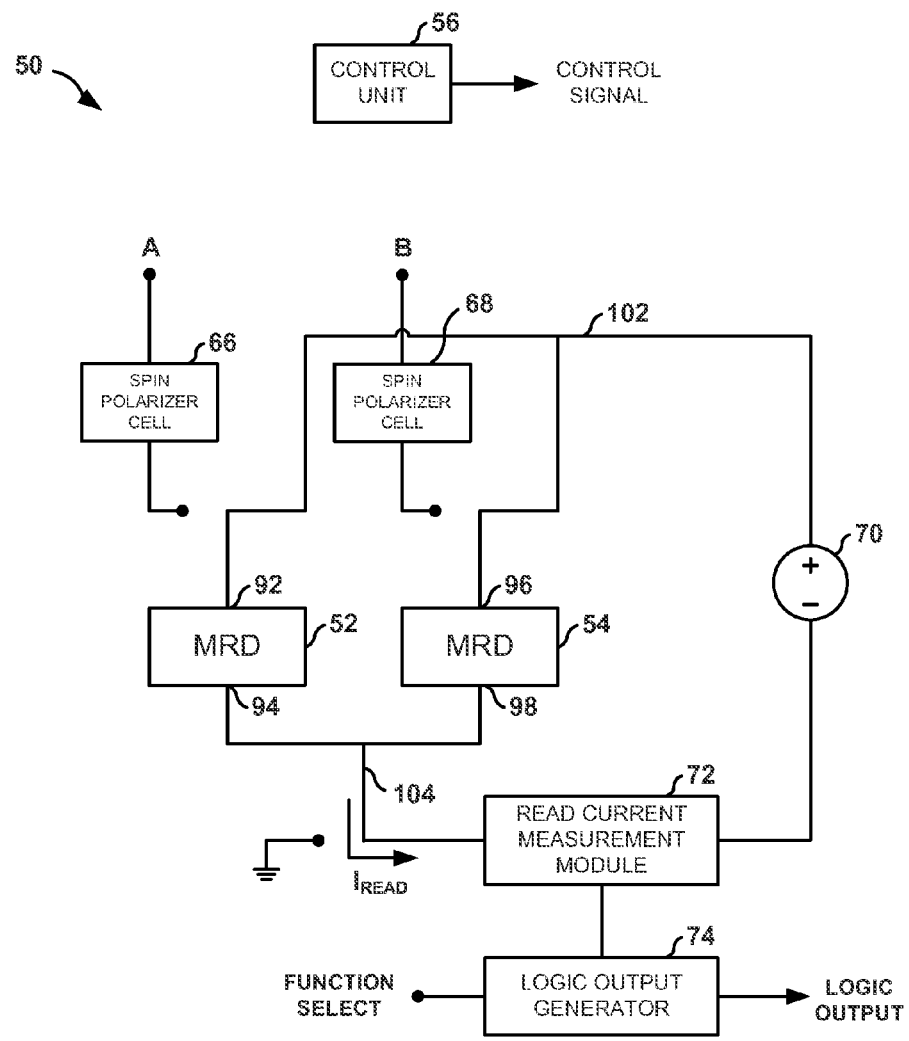
FIG. 6 is a schematic diagram illustrating the magnetic logic device of FIG. 3 configured in a read configuration according to this disclosure.

FIG. 6 is a schematic diagram illustrating the magnetic logic device 50 of FIG. 3 configured in a read configuration according to this disclosure. As shown in FIG. 6, when magnetic logic device is placed in the read configuration, the read circuit is electrically coupled to MRDs 52, 54, and the write circuit is decoupled from MRDs 52, 54. More specifically, a first terminal of the bias voltage source is electrically coupled to first terminals 92, 96 of MRDs 52, 54 and a first terminal of read current measurement module is electrically coupled to second terminals 94, 98 of MRDs 52, 54.

In addition, MRDs 52, 54 may be switched into a read configuration, which may include configuring MRDs 52, 54 such that the MRDs are electrically coupled in parallel to form a network of MRDs electrically coupled in parallel. As shown in the example of FIG. 6, the network of MRDs includes two MRDs 52, 54. Terminal 92 of MRD 52 is electrically coupled to terminal 96 of MRD 54, and terminal 94 of MRD 52 is electrically coupled to terminal 98 of MRD 54. A first end terminal 102 for the network of MRDs may be electrically coupled to terminals 92, 96. A second end terminal 104 for the network of MRDs may be electrically coupled to terminals 94, 98. The end terminals of the network may alternatively be referred to as "ends" of the network of MRDs.

While operating in the read configuration, bias voltage source 70 may apply a bias voltage across the network of MRDs 52, 54 electrically coupled in parallel. For example, as shown in FIG. 6, bias voltage source 70 may apply the bias voltage between end terminal 102 and end terminal 104 of the network of MRDs 52, 54 electrically coupled in parallel. The application of the bias voltage to end terminal 104 may involve allowing the voltage to propagate through read current measurement module 72.

In response to the bias voltage being applied across the network of MRDs, a read current ($I_{READ}$) may be induced in the loop formed by bias voltage source 70, MRDs 52, 54, and read current measurement module 72. As shown in FIG. 6, the read current may refer to the current propagating through terminals 102, 104 in the loop as opposed to the branch currents propagating through the individual MRD branches. The magnitude of the read current may correspond to the sum of the magnitudes of both of the branch currents. The magnitude of the read current is dependent on the magnetization states of both of MRDs 52, 54. For example, if both MRDs 52, 54 are in a high resistance state, then the read current may have a relatively low magnitude and be referred to herein as a "low read current." Similarly, if both MRDs 52, 54 are in a low resistance state, then the read current may have a relatively high magnitude and be referred to herein as a "high read current." If one of MRDs 52, 54 is in a low resistance state and the other in a high resistance state, then the read current may have a magnitude between the low read current and high read current magnitudes. Such a current may be referred to herein as an "intermediate read current."

Logic output generator 74 may generate a logic output value for a combinational logic function based on a magnitude of the read current produced at terminal 104 of the network of MRDs 52, 54 in response to the applied voltage. For example, read current measurement module 72 may generate an electrical signal indicative the magnitude of the read current, and logic output generator 74 may generate a logic output value based on the electrical signal. Logic output generator 74 may map the magnitude of the electrical signal to a binary value in order to generate the logic output value.

Logic output generator 74 may compare the magnitude of the electrical signal produced by read current measurement module 72 to a threshold. In some examples, the threshold may be a threshold that is between the low read current magnitude and the intermediate read current magnitude. Such a threshold may be used to implement an OR gate for example. In additional examples, the threshold may be a threshold that is between the intermediate read current magnitude and the high read current magnitude. Such a threshold may be used to implement an AND gate for example. In further examples, both of the above thresholds may be used to implement an XOR gate, an XNOR gate or a VOTING-OR gate. These techniques may also be used to implement NAND and NOR gates. In this manner, the two-input magnetic logic device 50 may be used to implement multiple types of combinational logic functions.

Figure 7A:
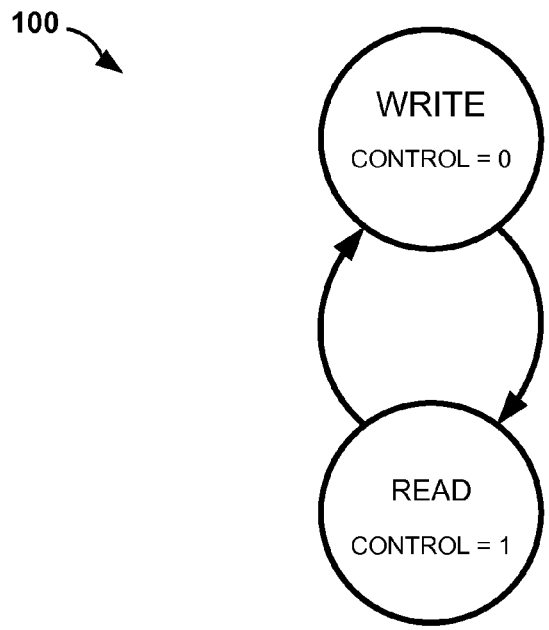
FIG. 7A is a state transition diagram illustrating an example implementation of a control unit for use in the magnetic logic devices of FIGS. 1 and 3 according to this disclosure.

FIG. 7A is a state transition diagram 100 illustrating an example implementation of a control unit for use in the magnetic logic devices 10 and 50 of FIGS. 1 and 3 according to this disclosure. For purposes of explanation, state transition diagram 100 will be described with respect to control unit 56 of FIG. 3.

State transition diagram 100 includes a Write state and a Read state. Control unit 56 may initialize into the Write state. During the Write state, control unit 56 generates a logic zero control signal, which may be used to control switching modules 58, 60, 62 to switch magnetic logic gate 50 into a write configuration (e.g., couple the T1 terminals to respective P terminals). In some examples, when operating in the Write State, control unit 56 may automatically select the Read state as the next state. In other words, the selection of the Read state as the next state may be independent of any external input received by control unit 56.

Control unit 56 may receive a timing signal that causes control unit 56 to initiate the transition from the Write state to the Read state. In some examples, the timing signal may be a clock signal, and control unit 56 may transition to the next state when a particular signal condition occurs in the clock signal (e.g., a positive transition, negative transition, positive level, negative level, etc.). In additional examples, the timing signal may not be a clock signal, but may be a timing signal that is activated by an external device. In any case, the timing signal may be used by control unit 56 to determine when to transition from the Write state to the Read state, but not necessarily used to determine to which particular state to transition.

During the Read state, control unit 56 generates a logic one control signal, which may be used to control switching modules 58, 60, 62 to configure magnetic logic device 50 into a read configuration (e.g., couple the T2 terminals to the respective P terminals). In some examples, when operating in the Read State, control unit 56 may automatically select the Write state as the next state. In other words, the selection of the Write state as the next state may be independent of any external input received by control unit 56. The timing signal may again be used to cause control unit 56 to initiate the transition from the Read state to the Write state.

As shown in FIG. 7A, control unit 56 may successively switch between the Write state and the Read state to continuously perform logic operations. The performance of a single logic operation may include the traversal of both the Write state and the Read state in automatic succession, i.e., switching magnetic logic device 50 into a write configuration and switching manetic logic device 50 into a read configuration in response to switching magnetic logic device 50 into a write configuration.

Figure 7B:
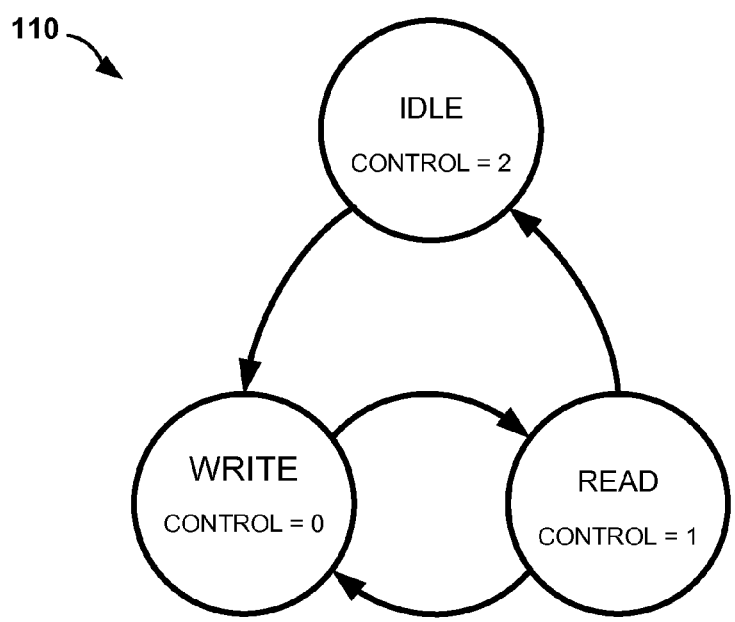
FIG. 7B is a state transition diagram illustrating another example implementation of a control unit for use in the magnetic logic devices of FIGS. 1 and 3 according to this disclosure.

FIG. 7B is a state transition diagram 110 illustrating another example implementation of a control unit for use in the magnetic logic devices 10 and 50 of FIGS. 1 and 3 according to this disclosure. For purposes of explanation, state transition diagram 110 will be described with respect to control unit 56 of FIG. 3.

State transition diagram 110 is similar to state transition diagram 100 of FIG. 7A except that state transition diagram 110 includes a third Idle state. The Idle state may correspond to a power-down state and/or a standby state. During operation, control unit 56 may initialize to the Idle state. While operating in the Idle state, control unit 56 may generate a control signal having a value of two (e.g., logic "10").

In some examples, while operating in the Idle state, control unit 56 may cause the write circuit and the read circuit in magnetic logic device 50 to power-down. In additional examples, magnetic logic device 50 may include "on-off-on" SPDT switching modules 58, 60, 62. In such examples, while operating in the Idle state, control unit 56 may cause the "on-off-on" switching modules 58, 60, 62 to switch to an off state where magnetic logic device 50 is neither in a write configuration nor a read configuration, i.e., neither a write circuit nor a read circuit is electrically coupled to MRDs 52, 54.

Control unit 56 may receive both a timing signal and an idle signal. The idle signal may indicate whether magnetic logic device 50 should be performing a logic operation or idling. Control unit 56 may remain in the Idle state when the idle signal indicates that magnetic logic device 50 should be idling. When the idle signal indicates that magnetic logic device 50 should be performing a logic operation, then control unit 56 may transition to the Write state.

After transitioning to the Write state, control unit 56 may perform logic operations by successively switching between the Write state and the Read state as long as the idle signal indicates that magnetic logic device 50 should be performing logic operations. When the Idle signal indicates that magnetic logic device 50 should be idling, control unit 56 may transition from the Read state back to the Idle state.

Figure 8:
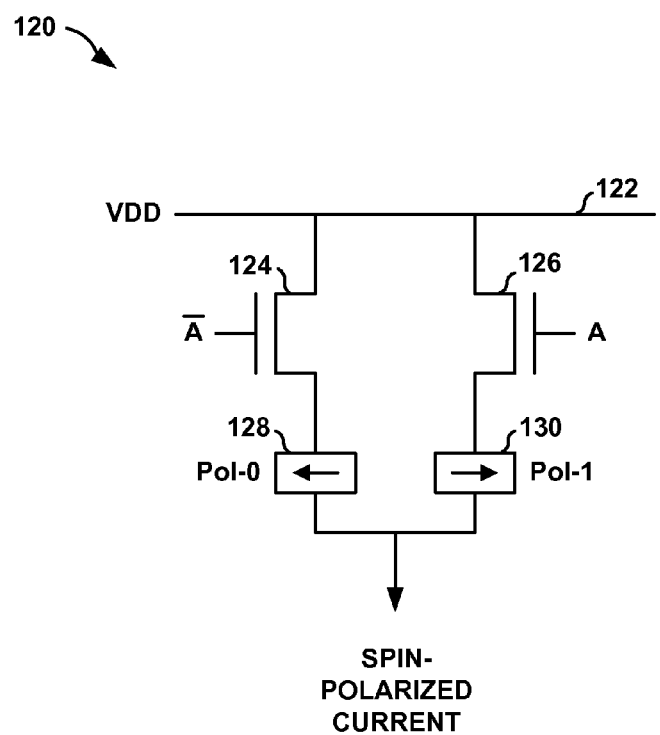
FIG. 8 is a schematic diagram illustrating an example spin polarizer cell for use within the magnetic logic device of FIG. 3 according to this disclosure.

FIG. 8 is a schematic illustrating an example spin polarizer cell 120 for use within the magnetic logic devices of FIGS. 1 and 3. Spin polarizer cell 120 is configured to receive a logic input value for a combinational logic function, and to generate a spin-polarized current having a spin direction that corresponds to the logic input value of the combinational logic function. Spin polarizer cell 120 includes a voltage supply line 122, transistors 124, 126, and spin filters 128, 130.

Transistor 124 includes a source terminal electrically coupled to supply line 122, a drain terminal electrically coupled to spin filter 128, and a gate terminal electrically coupled to a complemented version of the logic input signal (i.e., Ā). Transistor 126 includes a source terminal electrically coupled to supply line 122, a drain terminal electrically coupled to spin filter 130, and a gate terminal electrically coupled to an un-complemented version of logic input signal (i.e., A).

Spin filters 128, 130 are configured to receive a current from transistors 124, 126 and to generate a spin-polarized current. The spin direction of the spin-polarized current is determined by the type of spin filter. For example, spin filter 128 is a spin-down type spin filter configured to generate a spin-polarized current having a spin-down spin direction. Similarly, spin filter 130 is a spin-up type spin filter configured to generate a spin-polarized current having a spin-up spin direction.

Spin filter 128 includes an input terminal electrically coupled to the drain of transistor 124, and an output terminal electrically coupled to the spin-polarized current output terminal of spin polarizer cell 120. Spin filter 130 includes an input terminal electrically coupled to the drain of transistor 126, and an output terminal electrically coupled to the spin-polarized current output terminal of spin polarizer cell 120.

Spin filters 128, 130 may include a ferromagnetic material configured to polarize the spin direction (e.g., angular momentum) of the electrons passing through the ferromagnetic material into one of two spin directions (i.e., spin-up or spin-down). Ferromagnetic materials used to implement spin filters 128, 130 may include iron, nickel, cobalt, binary or ternary alloys of the preceding metals, or the like. As shown in FIG. 8, spin filter 128 is configured to polarize the electrons into a spin-down spin direction indicated by the left-hand arrow, and spin filter 130 is configured to polarize the electrons into a spin-up direction as indicated by the right hand arrow.

During operation, spin polarizer cell 120 receives a logic input value, and in some examples, the complement of the logic input value. If the complement of the logic input value is not received, then spin polarizer cell 120 may generate the complemented version of the logic input value.

If the logic input value is a logic zero, then transistor 124 supplies a current to spin filter 128 and transistor 126 does not supply current (or a negligible amount of current) to spin filter 130. Spin filter 128 polarizes the current to generate a spin-polarized current with a spin-down spin direction (i.e., Pol-0).

Similarly, if the logic input value is a logic one, then transistor 124 does not supply current (or a negligible amount of current) to spin filter 128 and transistor 126 supplies a current to spin filter 130. Spin filter 130 polarizes the current to generate a spin-polarized current with a spin-up spin direction (i.e., Pol-1).

Figure 9:
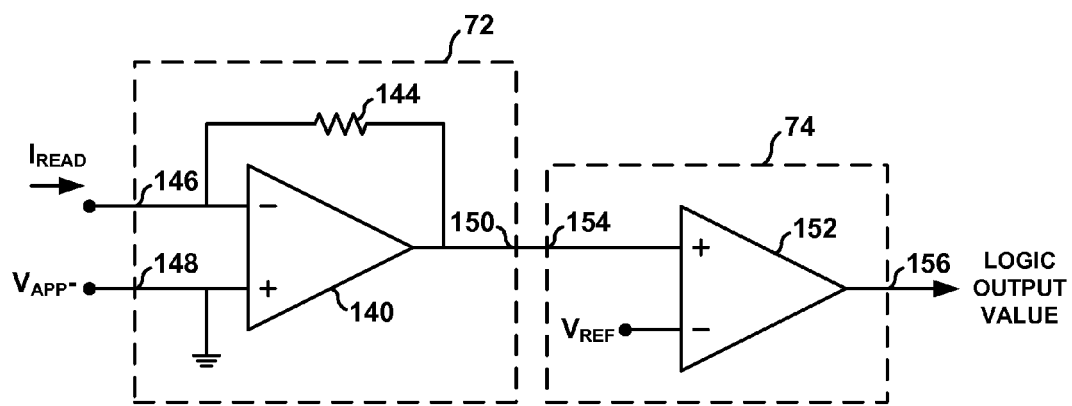
FIG. 9 is a schematic diagram illustrating an example read current measurement module and logic output generator for use within the magnetic logic device of FIG. 3 according to this disclosure.

FIG. 9 is a schematic illustrating an example read current measurement module 72 and logic output generator 74 for use within the magnetic logic device of FIG. 3. Read current measurement module 72 includes an operational amplifier 140, a resistor 144, and terminals 146, 148, 150. Terminal 146 is electrically coupled to an inverting input of operational amplifier 140 and to a first terminal of resistor 144. Terminal 148 is electrically coupled to a non-inverting input of operational amplifier 140, and may be electrically coupled to a ground terminal. Terminal 150 is electrically coupled to the output of operational amplifier 140 and to a second terminal of resistor 144.

Logic output generator 74 includes operational amplifier 152 and terminals 154, 156. Terminal 154 is electrically coupled to a non-inverting input of operational amplifier 152, and terminal 156 is electrically coupled to an output of operational amplifier 152. The inverting input of operational amplifier 152 may be electrically coupled to a reference voltage ($V_{REF}$). Output terminal 150 of read current measurement module 72 may be electrically coupled to input terminal 154 of logic output generator 74.

Terminal 146 of read current measurement module 72 is configured to receive a read current ($I_{READ}$) from MRDs 52, 54. Terminal 146 may be electrically coupled to an end terminal of the network of MRDs 52, 54, e.g., via switching module 62. In some examples, terminal 148 of read current measurement module 72 may be electrically coupled to a terminal of bias voltage source 70. In additional examples, terminal 148 may be coupled to a ground terminal and not to other portions of magnetic logic device 50.

The operation of read current measurement module 72 and logic output generator 74 shown in FIG. 9 will now be described. Read current measurement module 72 receives a read current via terminal 146. When the read current is a low read current, then read current measurement module 72 drives the voltage at terminal 150 to a low voltage level with respect to ground. Similarly, when the read current is an intermediate read current, then read current measurement module 72 drives the voltage at terminal 150 to an intermediate voltage level with respect to ground, and when the read current is a high read current, then read current measurement module 72 drives the voltage at terminal 150 to a high voltage level with respect to ground.

Operational amplifier 152 compares the voltage level received from read current measurement module 72 to a reference voltage ($V_{REF}$). If the voltage level is greater than $V_{REF}$, then operational amplifier 152 drives the logic output value at terminal 156 to a high logic level. Likewise, if the voltage level is less than $V_{REF}$, then operational amplifier 152 drives the logic output value at terminal 156 to a low logic level.

In some examples, $V_{REF}$ may be determined or selected based on the function select input of magnetic logic device 50 to configure magnetic logic device 50 to perform a particular combinational logic operation. In additional examples, $V_{REF}$ may be predetermined or hardwired for the logic gate. $V_{REF}$ may be generated, in some examples, using a voltage source.

In some examples, $V_{REF}$ may be a voltage that is between the low voltage level and the intermediate voltage level to implement, for example, an OR gate. In additional examples, $V_{REF}$ may be a voltage that is between the intermediate voltage level and the high voltage level to implement, for example, an AND gate. In further examples, multiple comparisons may be made to multiple reference voltages to implement an exclusive OR gate or a VOTING-OR gate. These techniques may also be used to implement NAND and NOR gates. In this manner, the two-input magnetic logic device 50 may be used to implement multiple types of combinational logic functions.

FIG. 10 is a truth table 160 illustrating example functionality for the magnetic logic device 50 of FIG. 3. The "A:Input" column represents a binary logic input value received by spin polarizer cell 66. The "B:Input" column represents a binary logic input value received by spin polarizer cell 68. The "A:Write" column represents the spin-polarization direction for the spin-polarized current generated by spin-polarizer cell 66. The "B:Write" column represents the spin-polarization direction for the spin-polarized current generated by spin-polarizer cell 68. The "A:Res" column represents the resistance state (i.e., magnetization state) of MRD 52. The "B:Res" column represents the resistance state (i.e., magnetization state) of MRD 54. The "$I_{Read}$" column represents the relative read current magnitude propagating through MRDs 52, 54 in response to a voltage applied by bias voltage source 70.

The "AND Function" column represents a binary logic output value generated by logic output generator 74 when magnetic logic gate 50 is configured to apply an AND function to the logic inputs. In such examples, logic output generator 74 may map current magnitudes that are less than the high current magnitude to a logic zero value, and current magnitudes that are greater than or equal to the high current magnitude to a logic one value.

The "OR Function" column represents a binary logic output value generated by logic output generator 74 when magnetic logic gate 50 is configured to apply an OR function to the logic inputs. In such examples, logic output generator 74 may map current magnitudes less than or equal to the low current magnitude to a logic zero value, and current magnitudes that are greater than the low current magnitude to a logic one value.

As shown in FIG. 10, magnetic logic gate 50 may act as either an AND gate or an OR gate depending on the mapping of read current to a logic output value. This mapping may be dynamically adjusted based on the function select input. Additional mappings may be used to implement an XOR gate, an XNOR gate, and a VOTING-OR gate.

Figure 11:
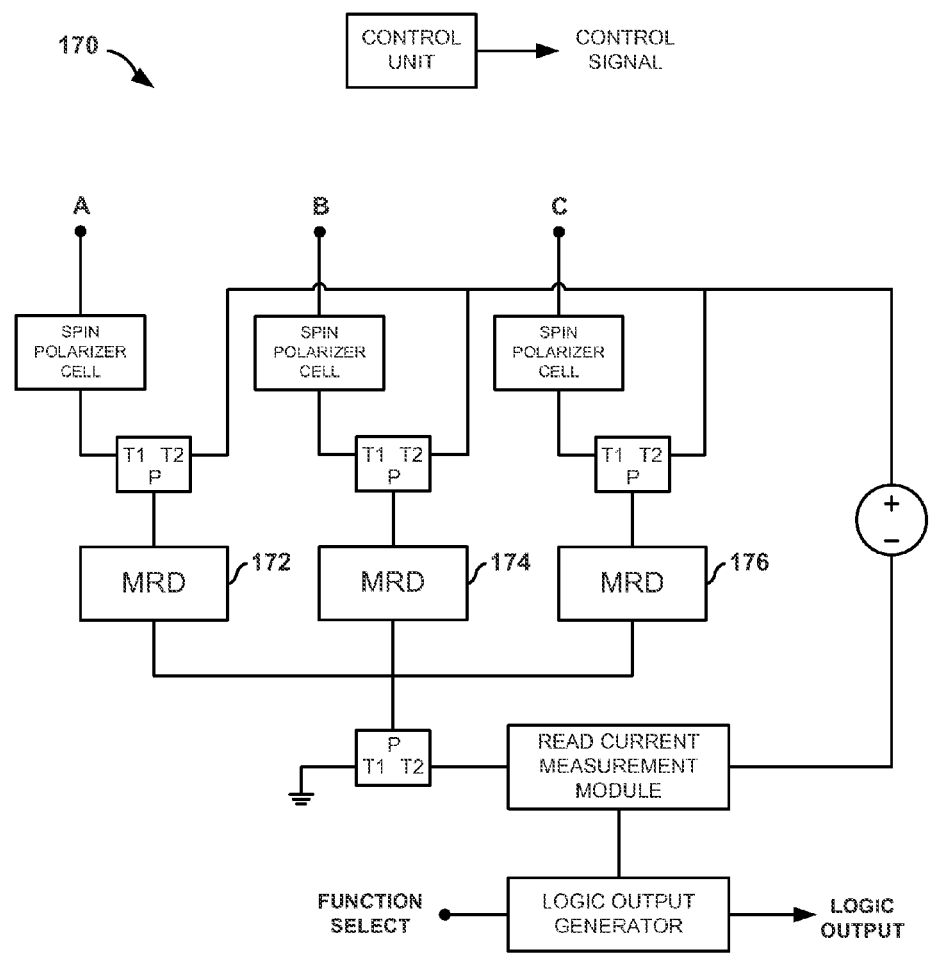
FIG. 11 is a schematic diagram illustrating an example three-input magnetic logic device according to this disclosure.

FIG. 11 is a schematic illustrating an example three-input magnetic logic device 170 according to this disclosure. Magnetic logic device 170 is similar to magnetic logic device 50 shown in FIG. 3 except that magnetic logic device 170 is configured to operate on three logic input values. Thus, magnetic logic device 170 includes three MRDs 172, 174, 176 configured in the manner shown in FIG. 11. Magnetic logic device 170 also includes an additional spin polarizer cell and an additional switching module. The components used to implement magnetic logic device 170 are substantially similar to the components used to implement magnetic logic device 50 shown in FIG. 3. Thus, similarly named components will not be described in the interest of brevity and to avoid redundancy. Moreover, the operation of magnetic logic device 170 is similar to the operation of magnetic device 50 shown in FIG. 3.

Figure 12:
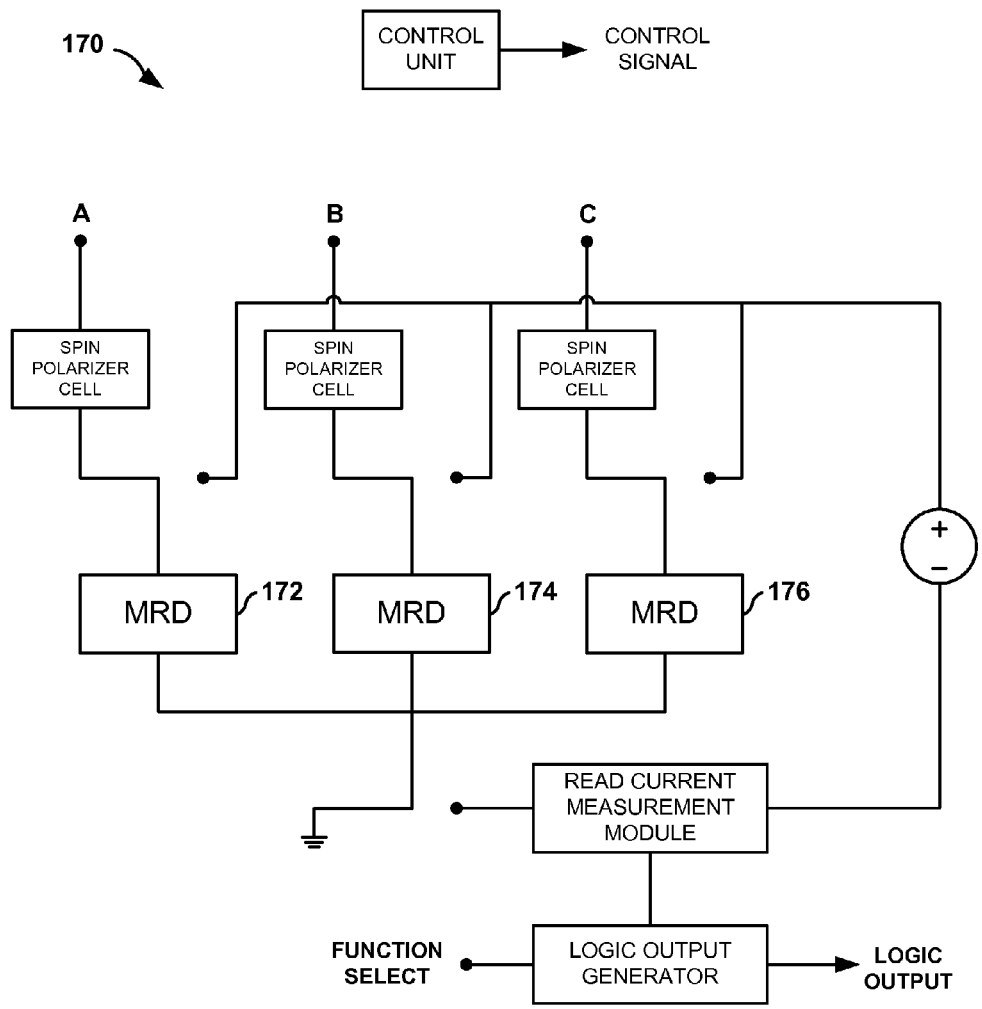
FIG. 12 is a schematic diagram illustrating the magnetic logic device of FIG. 11 configured in a write configuration according to this disclosure.
Figure 13:
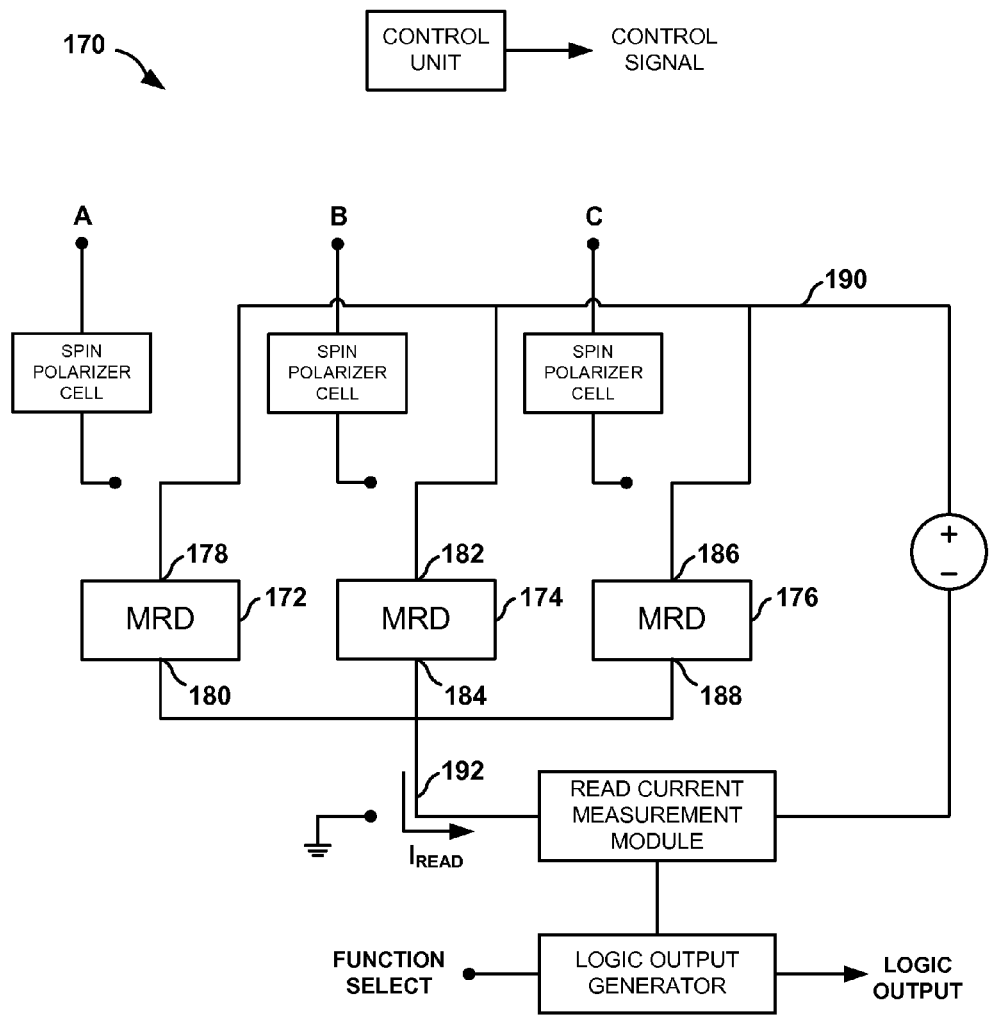
FIG. 13 is a schematic diagram illustrating the magnetic logic device of FIG. 11 configured in a read configuration according to this disclosure.

FIG. 12 is a schematic diagram illustrating the magnetic logic device of FIG. 11 configured in a write configuration according to this disclosure. FIG. 13 is a schematic diagram illustrating the magnetic logic device of FIG. 11 configured in a read configuration according to this disclosure. FIG. 13 illustrates a network of three MRDs 172, 174, 176 electrically coupled in parallel. Terminals 178, 182 and 186 of MRDs 172, 174 and 176 are electrically coupled to each other and to end terminal 190. Terminals 180, 184, 188 of MRDs 172, 174 and 176 are electrically coupled to each other and to end terminal 192.

Figure 14:
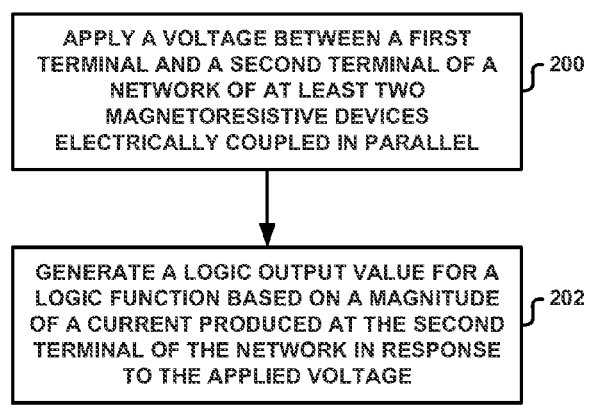
FIG. 14 is a flowchart illustrating an example technique for implementing a logic function with a magnetoresistive device according to this disclosure.

FIG. 14 is a flowchart illustrating an example technique for implementing a logic function with a magnetoresistive device according to this disclosure. In some examples, the technique in FIG. 14 may be used to implement magnetic logic device 10 illustrated in FIG. 1, magnetic logic device 50 illustrated in FIG. 3, and/or magnetic logic device 170 illustrated in FIG. 11.

Read circuit 20 applies a voltage between a first terminal and a second terminal of a network of at least two magnetoresistive devices electrically coupled in parallel (200). Read circuit 20 generates a logic output value for a logic function based on a magnitude of a current produced at the second terminal of the network in response to the applied voltage (202).

The network of magnetoresistive devices electrically coupled in parallel may include a first magnetoresistive device having a first terminal electrically coupled to a first terminal of a second magnetoresistive device, and a second terminal electrically coupled to a second terminal of the second magnetoresistive device. The voltage may be applied between respective first terminals and second terminals of the magnetoresistive devices.

Figure 15:
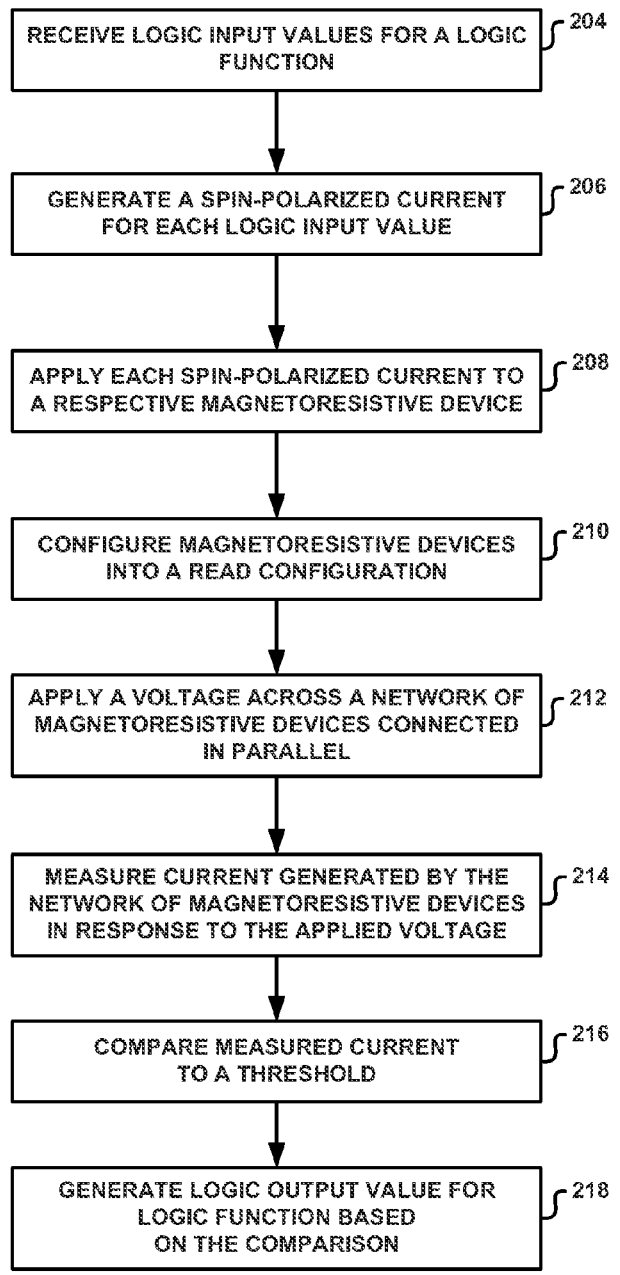
FIG. 15 is a flowchart illustrating another example technique for implementing a logic function with a magnetoresistive device according to this disclosure.

FIG. 15 is a flowchart illustrating another example technique for implementing a logic function with a magnetoresistive device according to this disclosure. In some examples, the technique in FIG. 15 may be used to implement magnetic logic device 10 illustrated in FIG. 1, magnetic logic device 50 illustrated in FIG. 3, and/or magnetic logic device 170 illustrated in FIG. 11.

The technique illustrated in FIG. 15 may, in some examples, be used to implement the techniques illustrated in FIG. 14. For example, process boxes 204, 206 and 208 may correspond to process box 200 illustrated in FIG. 14. In additional examples, process boxes 212, 214, 216 and 218 may correspond to process box 202 illustrated in FIG. 14.

Spin polarizer cells 66, 68 receive logic input values for a logic function (204), generate a respective spin-polarized current for each logic input value (206), and apply each spin-polarized current to a respective magnetoresistive device (208). Prior to applying the spin-polarized current, control unit 56 may direct switching modules 58, 60, 62 to configure magnetic logic device 50 into a write configuration.

Switching modules 58, 60, 62 may configure MRDs 52, 54 into a read configuration (210). For example, switching modules 58, 60, 62 may configure magnetoresistive devices such that the devices are electrically coupled in parallel to form a network of magnetoresistive devices electrically coupled in parallel.

Bias voltage source 70 applies a voltage across the network of the magnetoresistive devices electrically coupled in parallel (212). For example, bias voltage source 70 may apply a voltage between a first terminal and a second terminal of a network of at least two magnetoresistive devices electrically coupled in parallel. The first terminal and the second terminal may be located on opposite ends of the network of magnetoresistive devices.

Read current measurement module 72 measures the read current generated by the network of magnetoresistive devices in response to the applied voltage (214). In some examples, read current measurement module 72 may provide an electrical signal having a magnitude indicative of the magnitude of the measured read current to logic output generator 74. The electrical signal may be, in some examples, the read current itself. In further examples, the electrical signal may be a voltage-mode signal indicative of the magnitude of the read current.

Logic output generator 74 compares the measured current to a threshold (216). For example, logic output generator 74 may compare the magnitude of the electrical signal produced by read current measurement module 72 to the threshold. Logic output generator 74 generates a logic output value for logic function based on the comparison (218). For example, if the electrical signal is greater than the threshold, then logic output generator 74 may generate a first logic output value (e.g., a logic one). Similarly, if the electrical signal is less than the threshold, then logic output generator 74 may generate a second logic output value (e.g., a logic zero).

Figure 16:
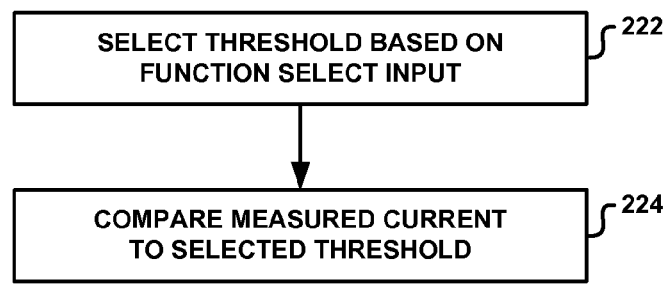
FIG. 16 is a flowchart illustrating another example technique for implementing a logic function with a magnetoresistive device according to this disclosure.

FIG. 16 is a flowchart illustrating another example technique for implementing a logic function with a magnetoresistive device according to this disclosure. In some examples, the technique in FIG. 16 may be used to implement magnetic logic device 10 illustrated in FIG. 1, magnetic logic device 50 illustrated in FIG. 3, and/or magnetic logic device 170 illustrated in FIG. 11.

The technique illustrated in FIG. 16 may, in some examples, be used to implement the techniques illustrated in FIGS. 14 and/or 15. For example, process boxes 220 and 222 may correspond to process box 202 illustrated in FIG. 14 or to process box 216 illustrated in FIG. 15.

Logic output generator 74 selects a threshold based on function select input (222). Logic output generator 74 compares the measured current to the selected threshold (224).

The techniques described herein may be able to produce integrated circuits having lower power consumption and/or increased chip density in comparison to integrated circuits that implement equivalent logic using a CMOS process technology. In contrast to transistor-based CMOS logic gates, the magnetic logic gates designed in accordance with this disclosure may be non-volatile, i.e., such gates may retain their state even if the logic gate is not receiving power. In addition, the techniques in this disclosure may be able to be monolithically integrated with conventional CMOS electronics.

The circuit components described in this disclosure can be implemented as discrete components, as one or more integrated devices, or any combination thereof. The circuit components described herein may be fabricated using any of a wide variety of process technologies including CMOS process technologies. In addition, the circuitry described herein may be used in various applications including telecommunications applications, general computing applications, or any other application.

Various aspects of the disclosure have been described. These and other aspects are within the scope of the following claims.

The invention claimed is:

1. A method comprising:
    applying a voltage between a first terminal and a second terminal of a network of at least two magnetoresistive devices electrically coupled in parallel; and
    generating a logic output value for a logic function based on a magnitude of a current produced at the second terminal of the network in response to the applied voltage.

2. The method of claim 1, further comprising:
    selecting, with a logic device, the logic function from a predetermined group of logic functions based on a function select parameter.

3. The method of claim 2, further comprising:
    measuring the current produced at the second terminal in response to the applied voltage,
    wherein selecting the logic function from the predetermined group of logic functions comprises selecting a threshold based on the function select parameter, and
    wherein generating the logic output value for the selected logic function comprises comparing the magnitude of the measured current to the selected threshold, and generating a logic output value for the selected logic function based on the comparison.

4. The method of claim 2, wherein the predetermined group of logic functions comprises an AND logic function and an OR logic function.

5. The method of claim 2, wherein the predetermined group of logic functions comprises a NAND logic function and a NOR logic function.

6. The method of claim 1, wherein the logic function comprises a voting-OR logic function.

7. The method of claim 1, further comprising:
    applying a respective spin-polarized current to each of the at least two magnetoresistive devices such that a respective magnetization state for each of the magnetoresistive devices corresponds to a respective logic input value of the logic function.

8. The method of claim 1, wherein generating the logic output value comprises:
    measuring the current produced at the second terminal in response to the applied voltage;
    comparing the measured current to a threshold; and
    generating a logic output value based on the comparison.

9. The method of claim 1, wherein the at least two magnetoresistive devices comprise at least one of a giant magnetoresistance (GMR) device, a magnetic tunnel junction (MTJ) device, and a tunneling magnetoresistance (TMR) device.

10. A device comprising:
    a network of at least two magnetoresistive devices electrically coupled in parallel; and
    a read circuit configured to apply a voltage between a first terminal and a second terminal of the network of at least two magnetoresistive devices electrically coupled in parallel, and generate a logic output value for a logic function based on a magnitude of a current produced at the second terminal of the network in response to the applied voltage.

11. The device of claim 10, wherein the read circuit comprises:
    a logic output generator configured to select the logic function from a predetermined group of logic functions based on a function select parameter.

12. The device of claim 11, wherein the read circuit further comprises:
    a read current measurement module configured to measure the current produced at the second terminal in response to the applied voltage,
    wherein the logic output generator is further configured to select a threshold based on the function select parameter, compare the magnitude of the measured current to the selected threshold, and generate a logic output value for the selected logic function based on the comparison.

13. The device of claim 11, wherein the predetermined group of logic functions comprises an AND logic function and an OR logic function.

14. The device of claim 11, wherein the predetermined group of logic functions comprises a NAND logic function and a NOR logic function.

15. The device of claim 10, wherein the logic function comprises a voting-OR logic function.

16. The device of claim 10, further comprising:
a write circuit configured to apply a respective spin-polarized current to each of the at least two magnetoresistive devices such that a respective magnetization state for each of the magnetoresistive devices corresponds to a respective logic input value of the logic function.

17. The device of claim 10, wherein the read circuit comprises:
a read current measurement module configured to measure the current produced at the second terminal in response to the applied voltage; and
a logic output generator configured to compare the measured current to a threshold, and generate a logic output value based on the comparison.

18. The device of claim 10, wherein the at least two magnetoresistive devices comprise at least one of a giant magnetoresistance (GMR) device, a magnetic tunnel junction (MTJ) device, and a tunneling magnetoresistance (TMR) device.

19. The device of claim 10,
wherein the network of at least two magnetoresistive devices comprises:
a first magnetoresistive device comprising a free layer terminal and a fixed layer terminal; and
a second magnetoresistive device comprising a free layer terminal and a fixed layer terminal,
wherein the free layer terminal of the first magnetoresistive device is electrically coupled to the free layer terminal of the second magnetoresistive device,
wherein the fixed layer terminal of the first magnetoresistive device is electrically coupled to the fixed layer terminal of the second magnetoresistive device,
wherein the read circuit comprises a bias voltage source configured to apply the voltage between the free layer terminals and the fixed layer terminals of the first and second magnetoresistive devices.

20. An apparatus comprising:
means for applying a voltage between a first terminal and a second terminal of a network of at least two magnetoresistive devices electrically coupled in parallel; and
means for generating a logic output value for a logic function based on a magnitude of a current produced at the second terminal of the network in response to the applied voltage.

* * * * *

UNITED STATES PATENT AND TRADEMARK OFFICE
CERTIFICATE OF CORRECTION

| | | |
|---|---|---|
| PATENT NO. | : 8,427,199 B2 | Page 1 of 1 |
| APPLICATION NO. | : 12/916174 | |
| DATED | : April 23, 2013 | |
| INVENTOR(S) | : Romney R. Katti | |

It is certified that error appears in the above-identified patent and that said Letters Patent is hereby corrected as shown below:

In the Specification

Column 17, line 45: says "signal indicative the magnitude", should say -- signal indicative of the magnitude --

Signed and Sealed this
Eleventh Day of March, 2014

Michelle K. Lee
*Deputy Director of the United States Patent and Trademark Office*